United States Patent
Kato et al.

[11] Patent Number: 6,061,278
[45] Date of Patent: May 9, 2000

[54] SEMICONDUCTOR MEMORY, DATA READ METHOD FOR SEMICONDUCTOR MEMORY AND DATA STORAGE APPARATUS

[75] Inventors: Yoshiharu Kato; Nobuyoshi Nakaya, both of Kasugai, Japan

[73] Assignee: Fujitsu Limited, Kanagawa, Japan

[21] Appl. No.: 09/166,072

[22] Filed: Oct. 5, 1998

[30] Foreign Application Priority Data

Dec. 10, 1997 [JP] Japan .................................. 9-340189
Jul. 28, 1998 [JP] Japan .................................. 10-213155

[51] Int. Cl.$^7$ .................................................. G11C 7/00
[52] U.S. Cl. ...................... 365/190; 365/203; 365/205; 365/207; 365/208; 365/222
[58] Field of Search ................................ 365/205, 207, 365/208, 190, 203, 222, 226

[56] References Cited

U.S. PATENT DOCUMENTS 5,742,552  4/1998  Greenberg .............................. 365/205
5,936,898  8/1999  Chi ........................................ 365/190

*Primary Examiner*—Trong Phan
*Attorney, Agent, or Firm*—Arent Fox Kintner Plotkin & Kahn LLP

[57] ABSTRACT

A semiconductor memory device comprises a plurality of memory cells for storing cell data. Word lines are connected to the memory cells. A first bit line includes a primary bit line connected to each memory cell and a secondary bit line. A first switching circuit is connected between the primary and secondary bit lines. A sense amplifier is connected to the secondary bit line. A second bit line is connected to the sense amplifier. A second switching circuit is connected between the second bit line and one of the primary and secondary bit lines.

52 Claims, 22 Drawing Sheets

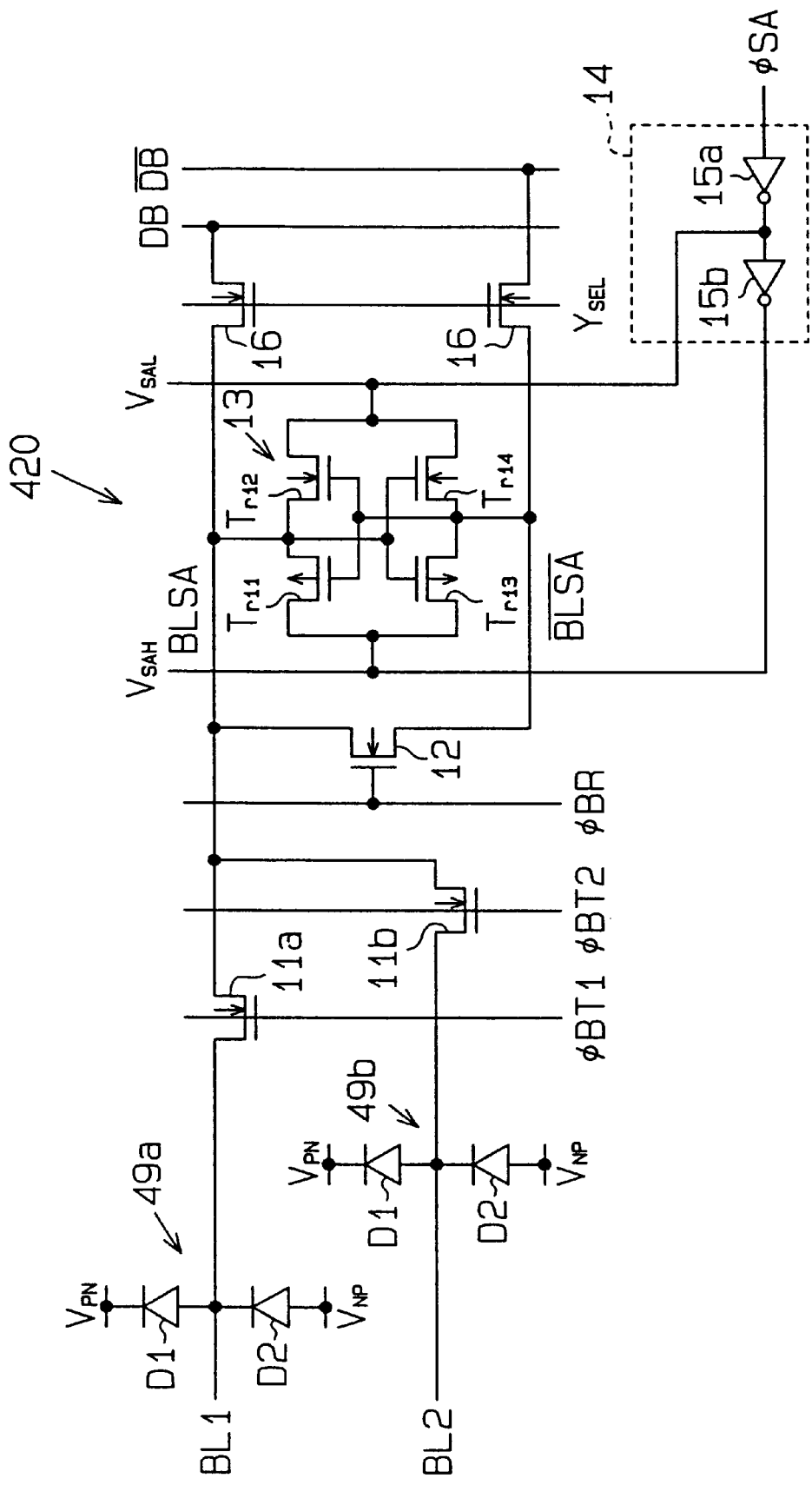

SEMICONDUCTOR MEMORY, DATA READ METHOD FOR SEMICONDUCTOR MEMORY AND DATA STORAGE APPARATUS

BACKGROUND OF THE INVENTION

The present invention generally relates to a data read circuit for a semiconductor memory, and more particularly to a data read circuit for reading data according to changes of signals at precharge levels.

Referring to FIG. 1, a conventional data read circuit for a DRAM 100 is equipped with a plurality of memory cells C forming a cell array, a plurality of word lines WL, a plurality of bit lines BL, and a sense amplifier (hereafter referred to as a sense amp) 2. Each memory cell C is connected to one of word lines WL and one of a pair of bit lines BL and /BL, respectively.

Each bit line BL, /BL is connected to a bit line BLSA or /BLSA via a transfer gate 1, respectively. The bit lines BLSA, /BLSA are connected to the sense amp 2. The transfer gate 1 includes an N-channel MOS transistor having a gate for receiving a bit line select signal φBT. When the bit line select signal φBT has a High (H) level, the transfer gate 1 is turned on.

The sense amp 2 is connected between the bit lines BLSA and /BLSA and the potential difference between the bit lines BLSA and /BLSA during its activation. The sense amp 2 comprises an inverter circuit including a P-channel MOS transistor Tr1 and an N-channel MOS transistor Tr2 and an inverter circuit including a P-channel MOS transistor Tr3 and an N-channel MOS transistor Tr4. The inverter circuits are connected inversely to each other with respect to the bit lines BLSA and /BLSA. The transistors Tr1 and Tr3 have a source for receiving a supply of an activation power supply signal $V_{SAH}$ and the transistors Tr2 and Tr4 have a source for receiving a supply of an activation power supply signal $V_{SAL}$. When the activation power supply signal $V_{SAH}$ has a high potential Vcc and the activation power supply signal $V_{SAL}$ has a low potential Vss, the sense amp 2 is activated. When the activation power supplies $V_{SAH}$ and $V_{SAL}$ have the same level, the sense amp 2 is deactivated.

Data buses DB and /DB are connected to the bit lines BLSA and /BLSA via a transfer gate 3, respectively. The transfer gate 3 includes an N-channel MOS transistor having a gate for receiving a column select signal $Y_{SEL}$. When the column select signal $Y_{SEL}$ has an H-level, the transfer gate 3 is turned on.

Each bit line BLSA and /BLSA is connected to a precharge circuit 4. The precharge circuit 4 is connected between the bit line BLSA or /BLSA and a precharge power supply Vcc/2, respectively and an N-channel MOS transistor having a gate for receiving a precharge signal φBR. When the signal φBR has an H-level, the precharge circuit 4 is activated, the precharge power supply having a Vcc/2 level is supplied to the bit lines BLSA and /BLSA, and both of the bit lines BL and /BL are precharged to the Vcc/2 level.

The operation of the data read circuit 100 will now be described with reference to FIG. 2. As shown in FIG. 2, when the bit line select signal φBT is maintained at the H-level, assume that a word line WL1 is selected in the preceding cycle, for example. In this case, the cell data read from the memory cell C that corresponds to the word line WL1 is amplified by the sense amp 2 and output to the bit lines BLSA and /BLSA.

To improve the read and write efficiency of the cell data, the power supply Vcc level is boosted before being supplied to the word line WL1. To improve the transfer efficiency of the transfer gate 1, the power supply Vcc level is boosted and then used as the bit line select signal φBT.

When the word line WL1 falls to the Low (L) level from this boosted state and subsequently both of the activation power supplies $V_{SAH}$ and $V_{SAL}$ converge to the Vcc/2 level, the sense amp 2 is deactivated. On the other hand, the precharge signal φBR rises to the H-level and the bit lines BLSA and /BLSA are precharged to the Vcc/2 level.

After the precharge circuit 4 has been deactivated by setting the precharge signal φBR to the L-level in the current cycle, for example, the word line WL2 is selected (the word line WL2 rises to the H-level). In this case, the cell data is read from the selected memory cell C to the bit line /BLSA and a slight potential difference (α) is generated between the bit lines BLSA and /BLSA based on the cell data.

When the activation power supply signal $V_{SAH}$ at the Vcc level and the activation power supply signal $V_{SAL}$ at the Vss level are supplied to the sense amp 2, the sense amp 2 is activated.

Hereupon, the potential difference (α) between the bit lines BLSA and /BLSA is increased by the operation of the sense amp 2. At this time, the cell data is rewritten to the memory cell C.

Subsequently, when the column select signal $Y_{SEL}$ is set to the H-level, the two transfer gates 3 are turned on and the cell data amplified by the sense amp 2 is output to the data buses DB and /DB. After the word line WL2 has been selected, the sense amp 2 is deactivated, the precharge circuit 4 is activated, and the bit lines BL, /BL, BLSA, and /BLSA are precharged to the Vcc/2 level.

The single cycle read operation is synchronized with a single cycle control signal /RAS (not illustrated).

Since the bit lines BLSA and /BLSA are precharged to the Vcc/2 level when the sense amp 2 is activated, when the level of one of the bit lines BLSA and /BLSA slightly rises from or falls to the Vcc/2 level, the cell data is read.

Hereupon, even if the voltage Vcc is supplied to the sense amp 2 by the activation power supply signal $V_{SAH}$ and the voltage Vss is supplied to the sense amp 2 by the activation power supply signal $V_{SAL}$, the gate potential and the drain potential of each transistor Tr1 to Tr4 of the sense amp 2 are set in the vicinity of the Vcc/2 level. Hence, the voltage between the source and the drain of each transistor Tr1 to Tr4 is set to Vcc/2±α (α indicates the potential change component of the bit lines caused by reading the cell data) or Vcc/2. The voltage between the gate and the source of each transistors Tr1 to Tr4 is also set to Vcc/2±α or Vcc/2.

As a result, because the voltage between the source and the drain and the voltage between the gate and the source of each transistor Tr1 to Tr4 are not fully secured for the potential difference of the power supply Vcc and Vss, the current drive performance of each transistor Tr1 to Tr4 is not be fully utilized. The deterioration becomes more pronounced as the voltage of the Vcc power supply decreases resulting in a lower operation speed.

Further, the precharge operation of each bit line BL, /BL, BLSA, /BLSA to the Vcc level and the amplification operation of the potential difference of the bit lines BL, /BL, BLSA, /BLSA based on the operation of the sense amp 2 are performed for each read cycle, respectively.

Accordingly, by the precharge operation and the amplification operation, charging current and discharging current are applied among the bit lines BL, /BL, BLSA, and /BLSA, the precharge circuit 4, and the sense amp 2. The current consumed by these charging and discharging currents accounts for a large proportion of the current consumption of the entire DRAM 100. Therefore, only when the current consumption based on the precharge operation and the amplification operation is reduced, is the power consumption of the DRAM 100 reduced effectively.

On the other hand, with the increase of storage capacity, because the number of memory cells connected to each bit line increases and the length of the bit line also increases, the capacity load and the resistance load for the precharge circuit increase. Hence, because the time required for the precharge circuit and the amplification operation of the bit line potential is prolonged, high-speed data read is difficult to achieve.

Accordingly, it is an object of the present invention to provide a data read circuit for a semiconductor memory with improved reading speed and reduced power consumption.

SUMMARY OF THE INVENTION

To achieve the above objective, the present invention provides a semiconductor memory device comprising: a plurality of memory cells for storing data; word lines connected to said memory cells; a first bit line including a primary bit line connected to said memory cells and a secondary bit line; a first switching circuit connected between the primary and secondary bit lines; a sense amplifier connected to the secondary bit line; a second bit line connected to the sense amplifier; and a second switching circuit connected between the second bit line and one of the primary and secondary bit lines.

The present invention further provides a semiconductor memory device comprising: a plurality of primary bit lines; a first switching circuit connected to each primary bit line; a secondary bit line connected to the first switching circuit, the secondary bit line and one of the primary bit lines forming a first bit line; a sense amplifier connected to the secondary bit line for receiving a first predetermined potential from a first power supply and a second power supply; a second bit line connected to the sense amplifier; a second switching circuit connected between the second bit line and the secondary bit line; and a clamping circuit, connected to each primary bit line, for clamping a potential of the associated primary bit line between the first power supply potential and the second power supply potential.

The present invention provides a semiconductor memory device for reading data stored in a plurality of memory cells, the device comprising: word lines connected to said memory cells; a first bit line and a second bit line, each of the first and second bit lines connected to one of the word lines via one of the memory cells, and each of the first and second bit lines including a primary bit line and a secondary bit line; a pair of first switching circuits, one of the first switching circuits connected between the primary and secondary bit lines of the first bit line, the other first switching circuit connected between the primary and secondary bit lines of the second bit line; a sense amplifier connected between the secondary bit lines; and a second switching circuit connected between the secondary bit lines.

The present invention further provides a semiconductor memory device comprising: a plurality of memory cells for storing data; a plurality of word lines respectively connected to the plurality of memory cells; a first bit line including a plurality of primary bit lines and a secondary bit line, each of the primary bit lines connected to an associated one of the memory cells; a plurality of first switching circuits, each connected between one of the primary bit lines and the secondary bit line; a sense amplifier connected to the secondary bit line; a second bit line connected to the sense amplifier; and a second switching circuit connected between the second bit line and the secondary bit line.

The present invention provides a data storage apparatus comprising: a plurality of memory cells; a reading device for reading data stored in the plurality of memory cells; and a reset circuit for resetting the data in the memory cells by writing the same data into at least two memory cells, wherein the reading memory device comprises: word lines connected to said memory cells; a first bit line including a primary bit line connected to said memory cells and a secondary bit line; a first switching circuit connected between the primary and secondary bit lines; a sense amplifier connected to the secondary bit line; a second bit line connected to the sense amplifier; and a second switching circuit connected between the second bit line and one of the primary and secondary bit lines.

The present invention further provides a method for reading data in a semiconductor memory device, the method comprising the steps of: providing a semiconductor memory device comprising: a plurality of memory cells for storing data; word lines connected to said memory cells; a first bit line including a primary bit line connected to said memory cells and a secondary bit line; a first switching circuit connected between the primary and secondary bit lines; a sense amplifier connected to the secondary bit line; a second bit line connected to the sense amplifier; and a second switching circuit connected between the second bit line and one of the primary and secondary bit lines; setting an output terminal of the sense amplifier to a high impedance state by deactivating the sense amplifier; precharging the first and second bit lines by connecting the first and second bit lines to each other to distribute charges stored therein, wherein the first bit line includes the primary and secondary bit lines and has a capacitance greater than that of the second bit line; reading data on the secondary bit line; disconnecting the primary bit line from the secondary bit line; and generating read data by amplifying the potential difference between the secondary bit line and the second bit line with the sense amplifier.

The present invention provides a method for reading data stored in a semiconductor memory device, the method comprising the steps of: providing the semiconductor memory device comprising: a plurality of memory cells for storing data; a plurality of word lines respectively connected to the memory cells; a first bit line including a plurality of primary bit lines and a secondary bit line, each of the primary bit lines connected to one of the associated memory cells; a plurality of first switching circuits, each connected between one of the primary bit lines and the secondary bit line; a sense amplifier connected to the secondary bit line; a second bit line connected to the sense amplifier; and a second switching circuit connected between the second bit line and the secondary bit line; setting an output terminal of the sense amplifier to a high impedance state by deactivating the sense amplifier; precharging the first and second bit lines by connecting the first and second bit lines together to distribute charges stored therein, wherein the primary bit lines and the secondary bit line, having a capacitance greater than that of the second bit line; selecting a world line connected to the memory cell associated with the primary bit line such that the primary bit lines are connected to the secondary bit line in order; reading data on the secondary bit line via the primary bit line from the associated memory cell; disconnecting the primary bit line from the secondary bit line; and generating read data by amplifying the potential difference between the secondary bit line and the second bit line with the sense amplifier.

The present invention further provides a method for reading data in a semiconductor memory device, the method comprising the steps of: providing the semiconductor memory device comprising: a plurality of primary bit lines; a first switching circuit connected to each of the primary bit lines; a secondary bit line connected to the first switching circuit, the secondary bit line and the primary bit lone forming a first bit line; a sense amplifier connected to the secondary bit line for receiving a first predetermined potential from a first power supply and a second predetermined potential from a second power supply; a second bit line connected to the sense amplifier; a second switching circuit connected between the second bit line and the secondary bit line; and a clamping circuit connected to each of the primary bit lines for clamping the potential of the associated primary bit line between the first power supply potential and the second power supply potential; setting an output terminal of the sense amplifier to a high impedance by deactivating the sense amplifier; precharging the first and second bit lines by connecting the bit lines together to distribute charges stored therein, wherein the plurality of primary bit lines and the secondary bit line have a capacitance greater than that of the second bit line; selecting a world line connected to the clamp circuit associated with the primary bit line such that the primary bit lines are connected to the secondary bit line in order; reading data on the secondary bit line via the primary bit line from the associated clamp circuit; disconnecting the primary bit line from the secondary bit line; and generating read data by amplifying the potential difference between the secondary bit line and the second bit line with the sense amplifier.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 26 is a circuit diagram illustrating a data read circuit according to a twelfth embodiment;

DETAILED DESCRIPTION OF THE PREFERRED EMBODIMENTS

Figure 1:
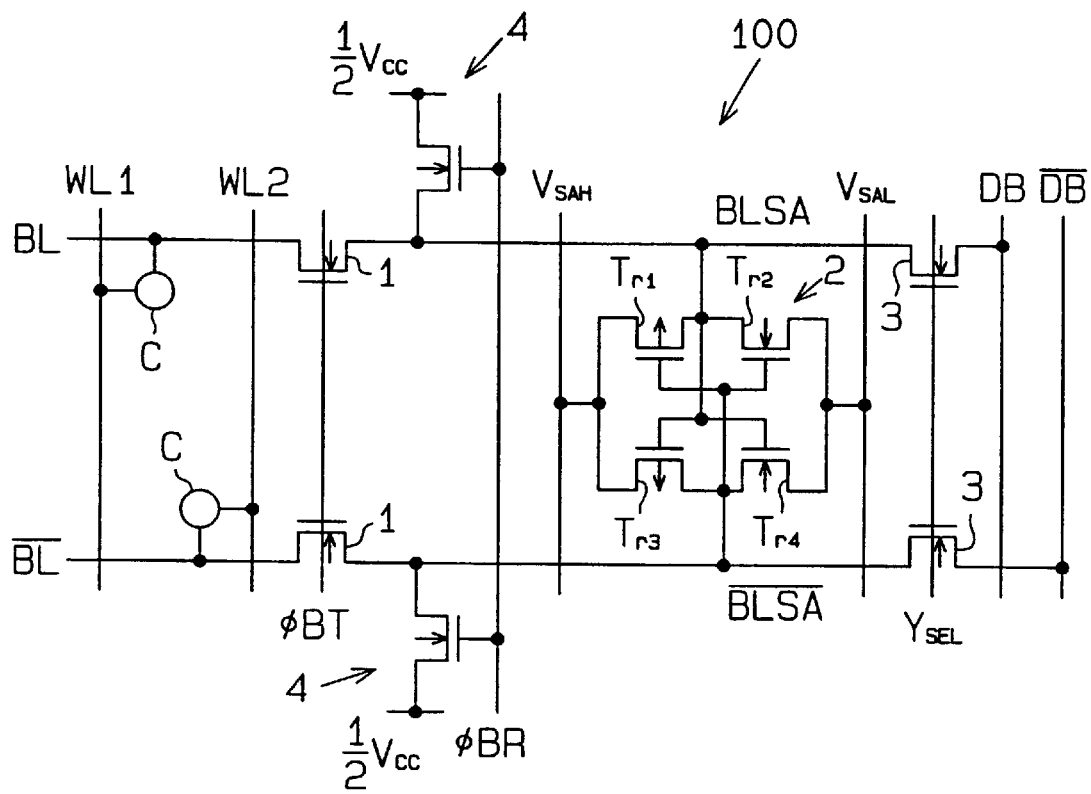
FIG. 1 is a circuit diagram illustrating a conventional data read circuit.
Figure 2:
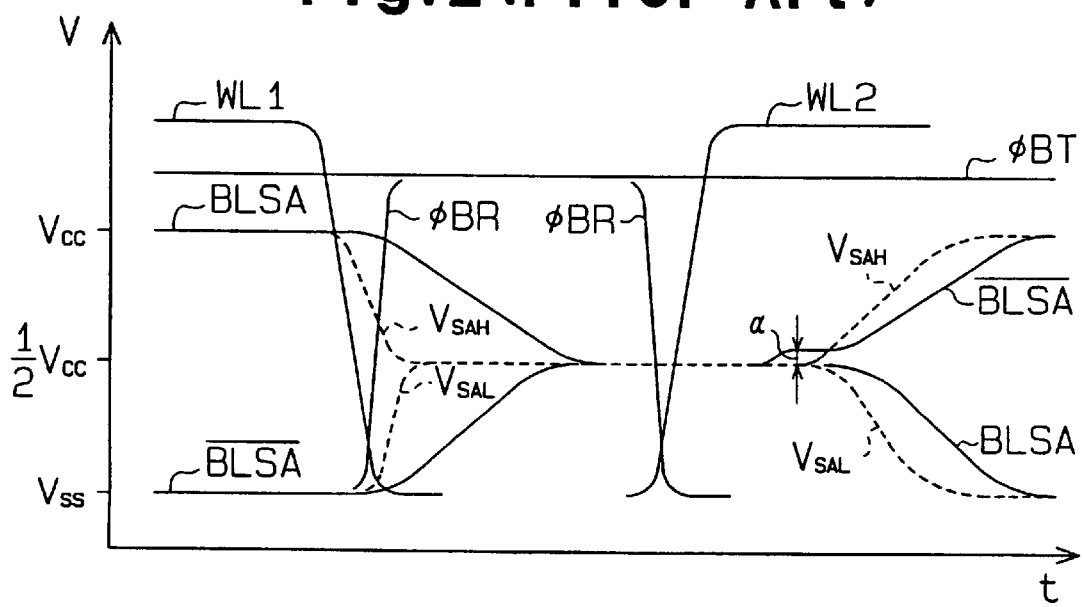
FIG. 2 is a timing chart illustrating the operation of the data read circuit of FIG. 1.
Figure 3:
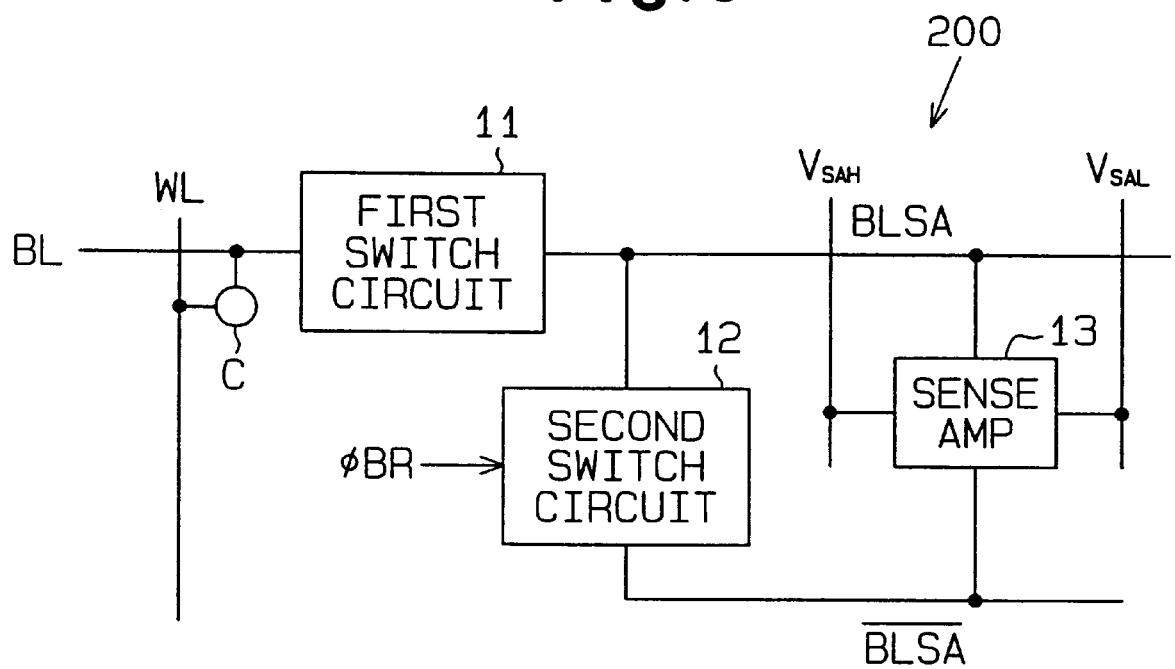
FIG. 3 is a schematic block diagram of the present invention.

First, a general description of the present invention is described with reference to FIG. 3. As shown in FIG. 3, a data read circuit 200 comprises a memory cell C, first and second switch circuits 11 and 12, and a sense amp 13. The memory cell C is connected to a first bit line and a word line WL. The first bit line includes a primary bit line BL connected to the first switch circuit 11 and the memory cell C and a secondary bit line BLSA connected to the first switch circuit 11, the second switch circuit 12 and the sense amp 13. The first switch circuit 11 is turned off for a predetermined time after the sense amp 13 has been activated. The sense amp 13 is connected between the secondary bit line BLSA and a second bit line /BLSA. The second switch circuit 12 is connected between the secondary bit line BLSA and the second bit line /BLSA and is selectively turned on and off in response to a precharge signal φBR.

When the second switch circuit 12 is turned on in response to the precharge signal φBR, the secondary bit line BLSA and the second bit line /BLSA are set to the same potential. After the word line WL has been selected, the sense amp 13 is activated by a pair of sense amp activation power supplies $V_{SAH}$ and $V_{SAL}$. The sense amp 13 amplifies the cell data read from the memory cell C and output to the secondary bit line BLSA. During the amplification operation of the cell data, the primary bit line BL and the secondary bit line BLSA are disconnected by the first circuit 11 being turned off.

During the precharge operation, the charging electric loads on the primary and the secondary bit lines BL and BLSA and the second bit line /BLSA are redistributed. At this time, the charging current and discharging current do not need to be supplied to the primary and second bit lines BL and /BLSA. Accordingly, the current consumption at this time is reduced.

Due to a difference in length, the charging capacity of the bit lines BL and BLSA is greater than that of the bit line /BLSA. This allows the precharge voltage to be set to a level that is slightly lower than the high potential power supply level or to a level that is slightly higher than the low potential power supply level. Accordingly, during the activation of the sense amp 13, the current drive performance of the sense amp 13 is fully utilized and the operation speed of the sense amp 13 is improved.

FIRST EMBODIMENT

Figure 4:
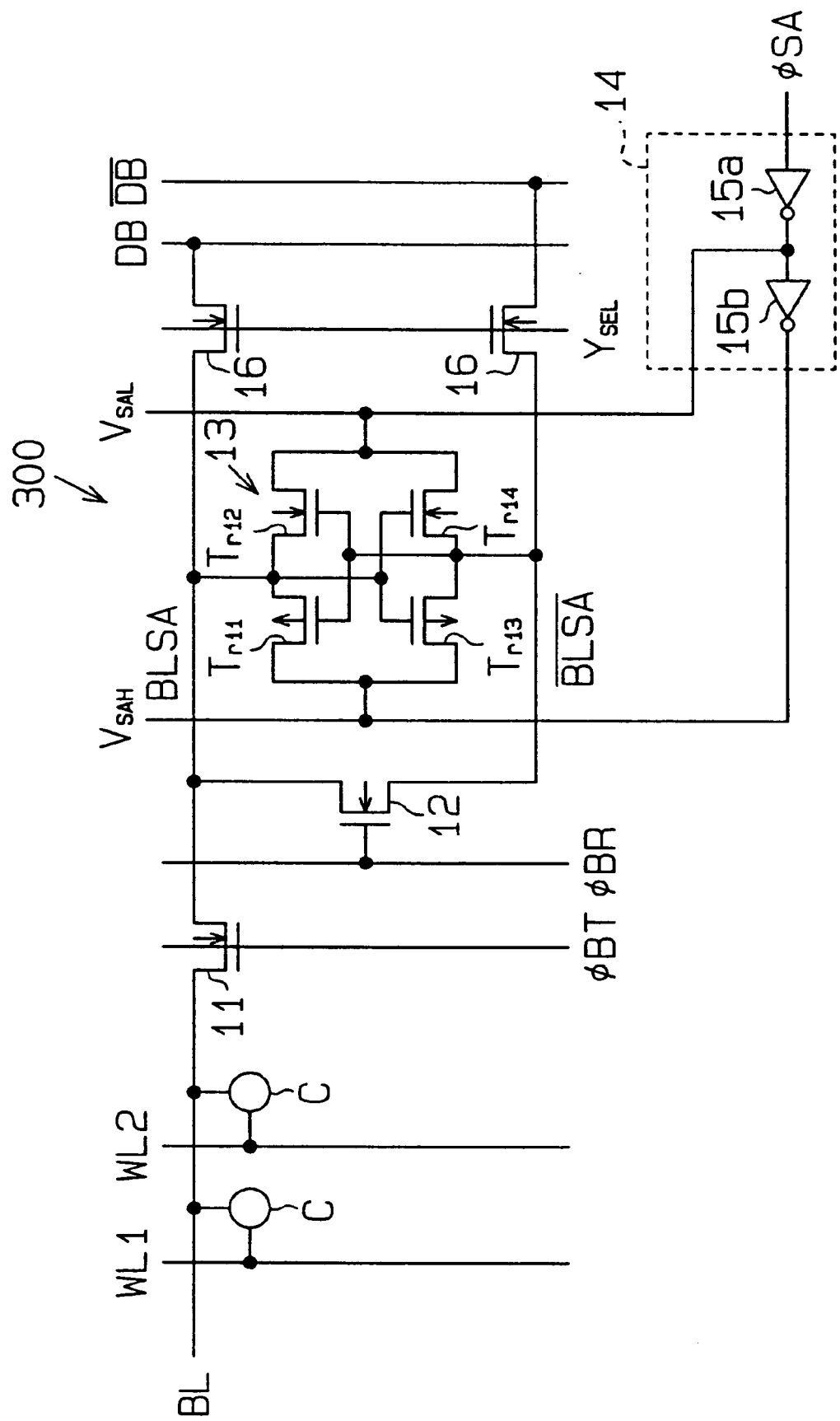
FIG. 4 is a circuit diagram illustrating a data read circuit according to a first embodiment of the present invention.

A DRAM data read circuit according to a first embodiment of the present invention is described below with reference to FIG. 4. As shown in FIG. 4, the data read circuit 300 comprises a plurality of bit lines BL (only one line is shown in FIG. 4), a plurality of word lines WL, a plurality of memory cells C connected to the bit line BL and the word lines WL, a sense amp 13 and a power control circuit 14.

The bit line BL is connected to a bit line BLSA of the sense amp 13 via a first switch circuit or transfer gate 11 which preferably comprises an N-channel MOS transistor. The transfer gate 11 receives a bit line select signal φBT and is turned on in response to the bit line select signal φBT having the H-level.

The bit line BLSA is connected to a bit line /BLSA via a second switch circuit preferably comprises a short-circuiting transistor 12 comprising an N-channel MOS transistor. According to the present invention, the bit line /BLSA is much shorter than the bit line /BLSA. The short-circuiting transistor 12 or the second switch circuit has a gate for receiving a precharge signal φBR and is turned on in response to the precharge signal φBR having the H-level. Hence, the connection between the bit lines BLSA and /BLSA is short-circuited. On the other hand, the short-circuiting transistor 12 is turned off in response to the precharge signal φBR having the L-level.

The sense amp 13 is connected between the bit lines BLSA and /BLSA. The sense amp 13 includes P-channel MOS transistors Tr11 and Tr13 and N-channel MOS transistors Tr12 and Tr14.

The power control circuit 14 includes inverter circuits 15a and 15b and supplies the activation power supply signals $V_{SAH}$ and $V_{SAL}$ to the sense amp 13. The inverter circuit 15a receives a sense amp activation signal φSA and supplies the activation power supply signal $V_{SAL}$ to the sense amp 13 and the inverter 15b. The inverter circuit 15b supplies the activation power supply signal $V_{SAH}$ to the sense amp 13. The inverter circuits 15a and 15b receive power from the power supplies Vcc and Vss (not shown) and supply the activation power supply signals $V_{SAH}$ (power supply Vcc) and $V_{SAH}$ (power supply Vss) to the sense amp 13 in response to the sense amp activation signal φSA having the H-level. The inverter circuits 15a and 15b also supply the activation power supply signal $V_{SAH}$ (Power supply Vss) and the activation power supply signal $V_{SAL}$ (power supply Vcc) to the sense amp 13 in response to the sense amp activation signal φSA having the L-level.

The bit lines BLSA and /BLSA are connected to data buses DB and /DB via a transfer gate, or a coloum gate 16 comprising an N-channel MOS transistor. The coloum gate 16 is turned on in response to a column select signal $Y_{SEL}$ having the H-level.

An internal signal generation circuit (not illustrated) generates the bit line select signal φBT, the precharge signal φBR, and the sense amp activation signal φSA according to control signals of an external control circuit.

Figure 5:
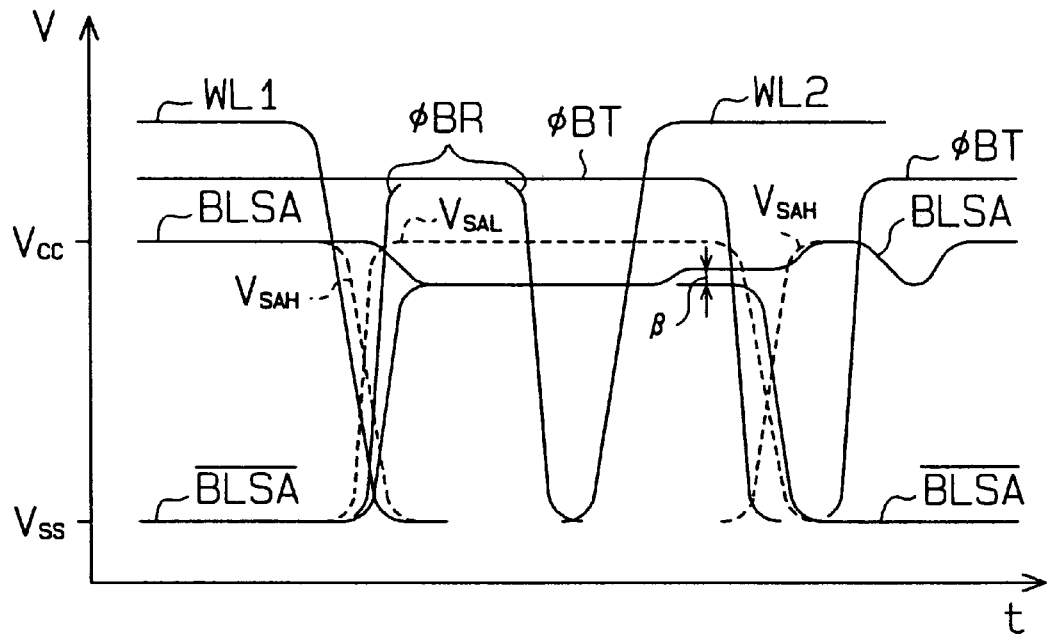
FIGS. 5 to 8 are timing charts illustrating the operation of the data read circuit of FIG. 4.

The operation of the data read circuit 300 will now be described with reference to FIGS. 5 to 8. As shown in FIG. 5, assume that the word line WL1 is selected in the preceding cycle and the cell data is output to the bit lines BLSA and /BLSA by the operation of the sense amp 13. When the read cycle has terminated, the word line WL1 falls to the L-level. When the sense amp activation signal φSA is set to the L-level, the activation power supply signal $V_{SAH}$ is set to the power supply Vss level, and the activation power supply signal $V_{SAL}$ is set to the power supply Vcc level according to the read instruction of the current cycle, which deactivates the sense amp 13.

Subsequently, when the precharge signal φBR rises to the H-level and the short-circuiting transistor 12 is turned on, the bit lines BLSA and /BLSA are short-circuited, the potential between the bit line BL, BLSA and the bit line /BLSA is equalized, and the precharge operation is performed. In the precharge operation, the total capacity of the bit lines BL, BLSA, and /BLSA is reduced to approximately half that of the conventional bit line, allowing the operation to be performed at high speed.

At this time, the cell data read to the bit line BLSA in the preceding cycle is at the H-level and the cell data read to the bit line /BLSA is at the L-level. Further, the capacity of both of the bit lines BL and BLSA is larger than that of the bit line /BLSA. Accordingly, the potential of the bit lines BL, BLSA, and /BLSA are equalized at a slightly lower level than the H-level (power supply Vcc level) of the read cell data.

After the precharge signal φBR has fallen to the L-level and the precharge operation has terminated, the read operation of the current cycle is initiated. Herein, for example, when the word line WL2 is selected, the word line WL2 rises to the H-level.

The cell data having the H-level is read from the memory cell C to the bit line BLSA via the bit line BL. Then, the potential of the bit line BLSA rises slightly and a potential difference β is generated between the bit lines BLSA and /BLSA.

Subsequently, the bit line select signal φBT falls to the L-level and the transfer gate 11 is turned off. When the sense amp activation signal φSA is set to the H-level, the activation power supply signal $V_{SAH}$ changes to the Vcc level and the activation power supply signal $V_{SAL}$ changes to the Vss level. Then, the sense amp 13 is activated and the potential difference between the bit lines BLSA and /BLSA is amplified. The bit line BLSA is set to the Vcc level and the bit line /BLSA is set to the Vss level.

At this time, in the sense amp 13 the voltage between the gate and the source of the transistors Tr12 and Tr14 is set to a value approximately equal to the voltage between Vcc and Vss, which allows the current drive performance of the transistors Tr12 and Tr14 to be fully utilized. According to the potential difference β between the bit lines BLSA and /BLSA, the drain current of the transistor Tr14 increases beyond the drain current of the transistor Tr12. The potential difference between the bit lines BLSA and /BLSA increases according to the current difference, so that the drain current of the transistor Tr11 increases beyond the drain current of the transistor Tr13, and the bit line BLSA converges to the Vcc level and the bit line /BLSA converges to the Vss level.

Then, when the bit line select signal φBT rises to the H-level and the transfer gate 11 is turned on, the cell data output to the bit line BLSA is rewritten to the memory cell C that is currently selected via the bit line BL. When the column select signal $Y_{SEL}$ changes to the H-level and the cell data (or, read data) output to the bit lines BLSA and /BLSA is output to the data buses DB and /DB, the read cycle terminates.

Figure 6:
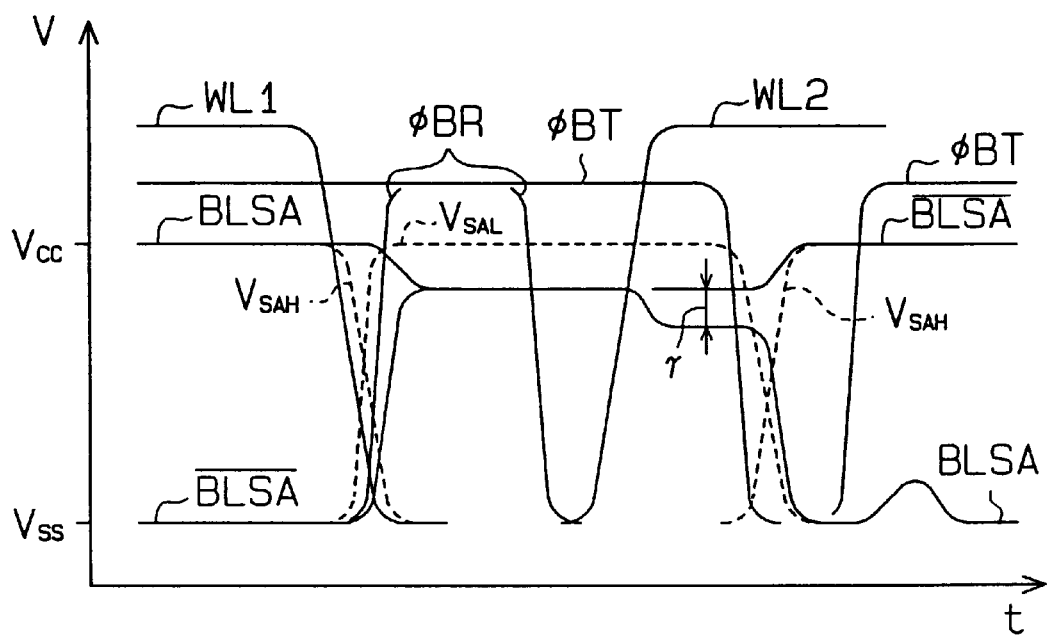

FIG. 6 shows the changes of various signals when the cell data having the H-level is output to the bit line BLSA in the preceding cycle and the cell data having the L-level is read to the bit line BLSA in the current cycle.

In this case, the bit lines BL, BLSA, and /BLSA are precharged to a slightly lower level than the power supply Vcc level in response to the leading edge of the precharge signal φBR. After the precharge operation has terminated, when the word line WL2 is selected in the current cycle and the cell data having the L-level is read to the bit lines BL and BLSA, the potential of the bit line BLSA decreases to a level lower than the precharge level and a slight potential difference γ is generated between the bit lines BLSA and /BLSA.

Subsequently, after the bit line select signal φBT has fallen to the L-level, when the sense amp 13 is activated, the potential difference between the bit lines BLSA and /BLSA is amplified, and the bit line BLSA changes to the power supply Vss level and the bit line /BLSA changes to the power supply Vcc level. At this time, in the sense amp 13 the voltage between the gate and source of the transistors Tr12 and Tr14 and the voltage between the drain and the source of the transistors Tr12 and Tr14 are set to a value approximately equal to the voltage between the power supplies Vcc and Vss, which allows the current drive capacities of the transistors Tr12 and Tr14 to be fully utilized. Based on the potential difference γ of the bit lines BLSA and /BLSA, the drain current of the transistor Tr12 increases beyond the drain current of the transistor Tr14, and the potential difference between the bit lines BLSA and /BLSA increases according to the current difference. The drain current of the transistor Tr13 increases beyond the drain current of the transistor Tr11, and the bit line BLSA converges to the power supply Vss level and the bit line /BLSA converges to the power supply Vcc level.

Then, when the bit line select signal φBT rises to the H-level and the transfer gate 11 is turned on, the cell data output to the bit line BLSA is rewritten to the selected memory cell C via the bit line BL.

Figure 7:
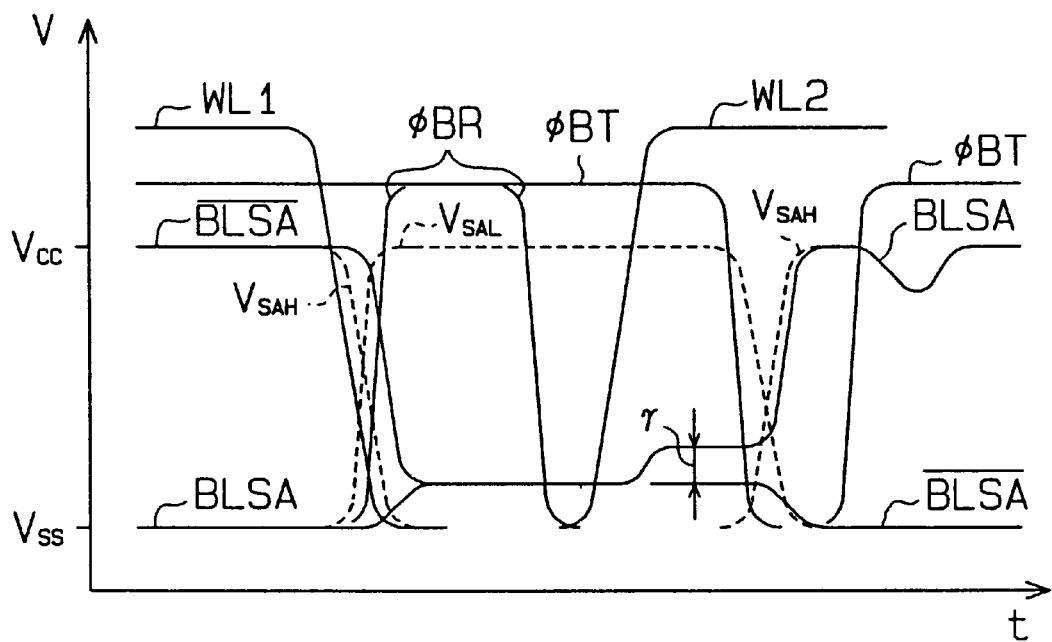

FIG. 7 shows the changes of various signals when the cell data having the L-level is output to the bit line BLSA in the preceding cycle and the cell data having the H-level is read to the bit line BLSA in the current cycle. The capacity between the bit lines BL and BLSA is larger than the capacity of the bit line /BLSA, which causes the bit lines BL, BLSA, and /BLSA to be precharged to a slightly higher level than the L-level (power supply Vss level) of the read data. After the precharge operation has terminated, when the word line WL2 is selected in the current cycle and the cell data having the H-level is read to the bit lines BL and BLSA, the potential of the bit line BLSA is set to a level higher than the precharge level and a slight potential difference γ is generated between the bit lines BLSA and /BLSA.

Subsequently, after the bit line select signal φBT has fallen to the L-level, when the sense amp 13 is activated, the potential difference between the bit lines BLSA and /BLSA is amplified, and the bit line BLSA changes to the power supply Vss level and the bit line /BLSA changes to the power supply Vcc level. At this time, the sense amp 13 the voltage between the gate and source of the transistors Tr11 and Tr13 and the voltage between the drain and the source of the transistors Tr11 and Tr13 are set to a value approximate to the voltage between the power supply Vcc and Vss, which allows the current drive performance between the transistors Tr11 and Tr13 to be fully utilized. Based on the potential difference γ between the bit lines BLSA and /BLSA, the drain current of the transistor Tr11 increases beyond the drain current of the transistor Tr13, and the potential difference between the bit lines BLSA and /BLSA increases according to the current difference. The drain current of the transistor Tr14 increases beyond the drain current of the transistor Tr12, and the bit line BLSA converges to the power supply Vcc level and the bit line /BLSA converges to the power supply Vss level.

Then, when the bit line select signal φBT rises to the H-level and the transfer gate 11 is turned on, the cell data output to the bit line BLSA is rewritten to the selected memory cell C via the bit line BL.

Then, when the column select signal $Y_{SEL}$ is set to the H-level and the data output to the bit lines BLSA and /BLSA is output to the data buses DB and /DB, the read cycle is terminated.

Figure 8:
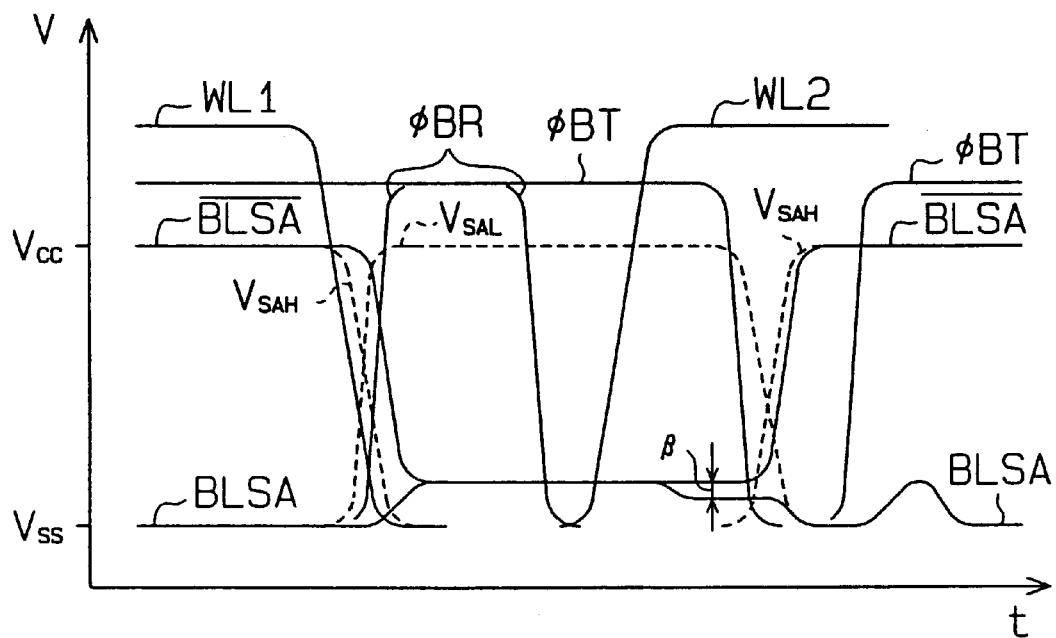

FIG. 8 shows the changes of various signals when the cell data having the L-level is output to the bit line BLSA in the preceding cycle and the cell data having the L-level is read to the bit line BLSA in the current cycle. In this case, the bit lines BL, BLSA, and /BLSA are precharged to a slightly higher level than the power supply Vss level.

After the precharge operation has terminated, when the word line WL2 is selected in the current cycle and the cell data having the L-level is read to the bit lines BL and BLSA, the potential of the bit line BLSA falls and a slight potential difference β is generated between the bit lines BLSA and /BLSA.

Subsequently, after the bit line select signal φBT has fallen to the L-level, when the sense amp 13 is activated, the potential difference between the bit lines BLSA and /BLSA is amplified, and the bit line BLSA changes to the power supply Vss level and the bit line /BLSA changes to the power supply Vcc level. At this time, because in the sense amp 13 the voltage between the gate and source of the transistors Tr11 and Tr13 and the voltage between the drain and the source of the transistors Tr11 and Tr13 are set to a value approximately equal to the voltage between the power supply Vcc and Vss, the current drive performance between the transistors Tr11 and Tr13 is fully utilized. Based on the potential difference β between the bit lines BLSA and /BLSA, the drain current of the transistor Tr11 increases beyond the drain current of the transistor Tr13, and the potential difference between the bit lines BLSA and /BLSA increases according to the current difference. The drain current of the transistor Tr14 increases beyond the drain current of the transistor Tr12, and the bit line BLSA converges to the power supply Vss level and the bit line /BLSA converges to the power supply Vcc level.

Then, when the bit line select signal φBT rises to the H-level and the transfer gate 11 is turned on, the cell data output to the bit line BLSA is rewritten to the selected memory cell C via the bit line BL.

Then, when the column select signal $Y_{SEL}$ is set to the H-level and the data output to the bit lines BLSA and /BLSA is output to the data buses DB and /DB, the read cycle is terminated.

As described above, the data read circuit 300 achieves the following effects:

(1) The bit lines BL, BLSA, and /BLSA are precharged by equalizing the potential between the bit lines BL, BLSA, and /BLSA using the short-circuiting transistor 12, which is turned on with the precharge signal φBR. This allows the circuit area of the DRAM to be reduced because a separate precharge circuit does not need to be provided.

(2) The precharge is performed by uniformly redistributing the load on the bit lines BL, BLSA and /BLSA based on the cell data output in the preceding cycle. Accordingly, because the charging current and the discharging current need not be supplied to the bit lines BL, BLSA, and /BLSA during the precharge operation, the current consumption during the precharge operation is reduced.

(3) Because the charging capacity between the bit lines BL and BLSA is larger than that of the bit line /BLSA, the precharge voltage is set to a slightly lower level than the power supply Vcc level or a slightly higher level than the power supply Vss level. Accordingly, the current drive performance of the P-channel MOS transistor or the N-channel MOS transistor of the sense amp 103 is fully utilized when the sense amp 13 is activated, which improves the operation speed of the sense amp 13.

(4) At the start of the amplification operation using the sense amp 13, the transfer gate 11 is turned off and the electrical connection between the bit lines BL and BLSA is disconnected. Accordingly, the load capacities of the bit lines BLSA and /BLSA connected to the output terminals of the sense amp 13 are matched and reduced, and so stable, high-speed operation of the sense amp 13 is enabled.

(5) When the cell data output to the bit line BLSA in the preceding cycle and the current cycle match, because the difference between the voltage level and the precharge voltage of the cell data in the current cycle is small, the charging current or discharging current caused by the amplification operation of the sense amp is small. Accordingly, the current consumption during the cell data output operation is greatly reduced.

(6) When the cell data output to the bit line BLSA differs from the preceding cycle to the current cycle, the charging operation or discharging operation for the bit lines BL and BLSA is mainly performed during the amplification operation of the sense amp 13 in the current cycle. Then, the charging operation or discharging operation for greatly changing the potential between the bit lines BL and BLSA is performed once per two cycles. Consequently, the power consumption is reduced as compared with the conventional circuit in which each charging and discharging operation is required during the precharge operation of each cycle and the output of the cell data.

(7) According to the present invention, the bit line /BLSA is much shorter than the bit line /BLSA of the conventional read circuit 100. Thus, the capacity of the bit line /BLSA is reduced and a high-speed precharge operation is enabled.

SECOND EMBODIMENT

Figure 9:
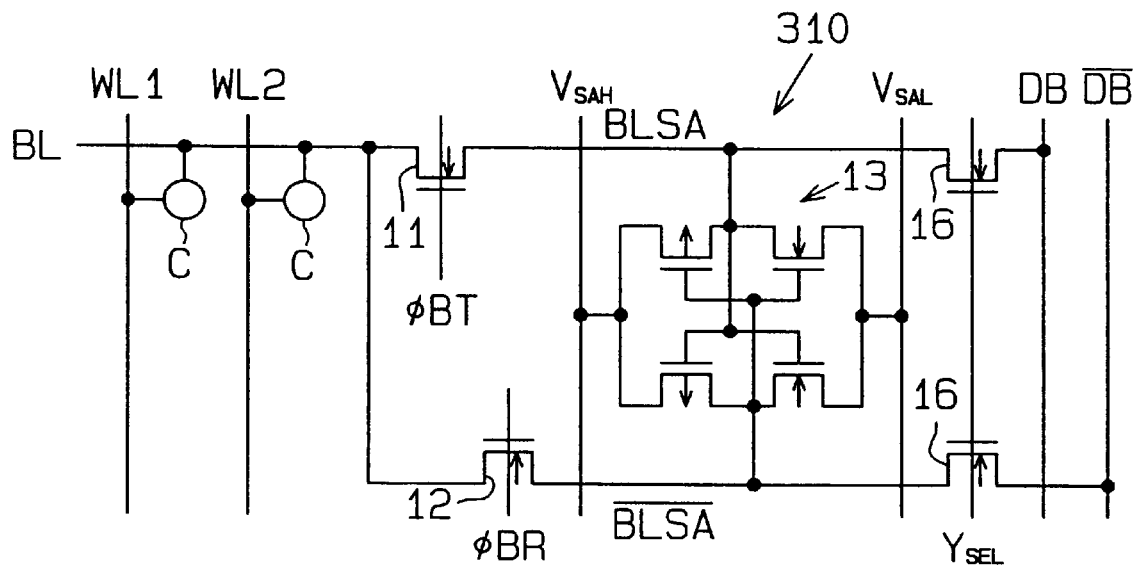
FIG. 9 is a circuit diagram illustrating a data read circuit according to a second embodiment of the present invention.

FIG. 9 shows a data read circuit 310 according to a second embodiment of the present invention. The read circuit 310 differs from the read circuit 300 in that the bit line /BLSA is connected to the bit line BL via the short-circuiting transistor 12, as opposed to being connected to the bit line BLSA. The data read circuit 310 also has the same effect as the first embodiment.

THIRD EMBODIMENT

Figure 10:
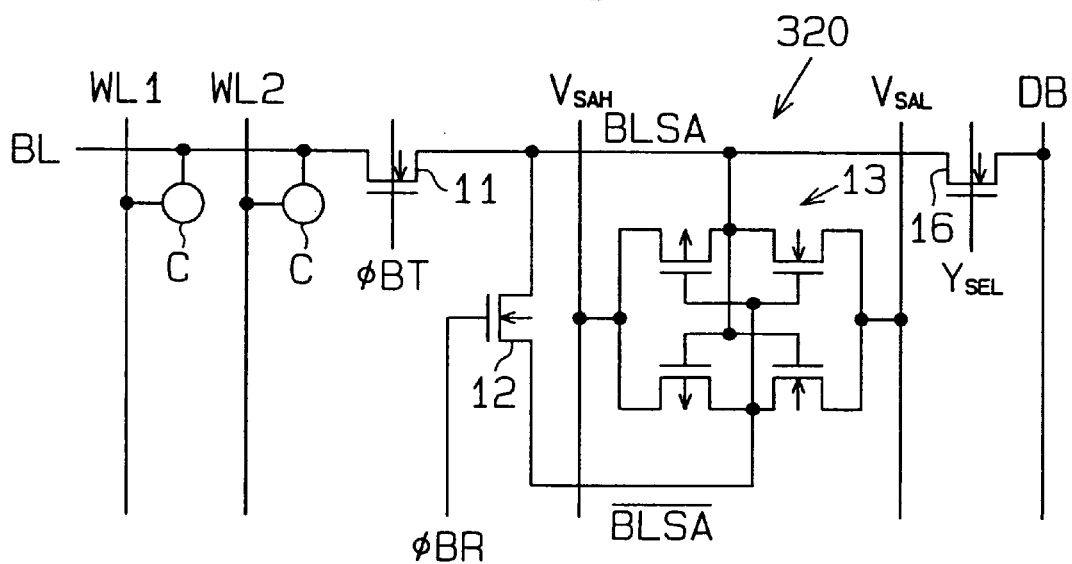
FIG. 10 is a circuit diagram illustrating a data read circuit according to a third embodiment of the present invention.

FIG. 10 shows a data read circuit 320 according to a third embodiment of the present invention. The data read circuit 320 eliminates the data bus /DB and the column gate 16 connected between the data bus /DB and the bit line /BLSA from the data read circuit 300 of the first embodiment. The omission of the data bus /DB and the coloum gate 16 reduces the length of the bit line /BLSA so that the bit line /BLSA extends only between the output terminal of the sense amp 13 and the short-circuiting transistor 12.

The data read circuit 320 outputs the cell data using the single data bus DB. The load capacity is reduced effectively due to the reduction in the length of the bit line /BLSA.

FOURTH EMBODIMENT

Figure 11:
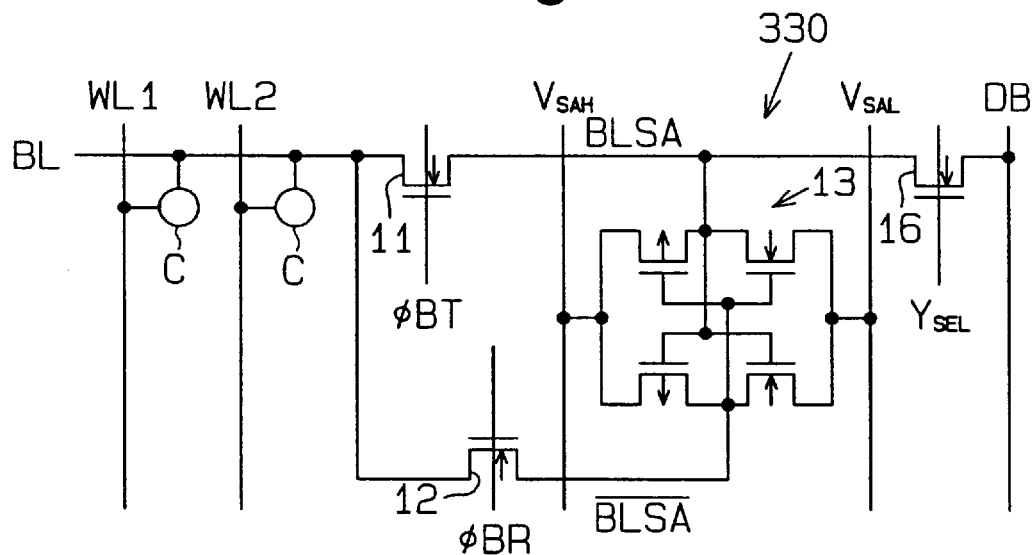
FIG. 11 is a circuit diagram illustrating a data read circuit according to a fourth embodiment.

As shown in FIG. 11, a data read circuit 330 according to a fourth embodiment of the present invention eliminates the data bus /DB and the coloum gate 16 connected the data bus /DB and the bit line /BLSA from the data read circuit 310 of the second embodiment, which reduces the length of the bit line /BLSA so that it extends between the output terminal of the sense amp 13 and the short-circuiting transistor 12.

The load capacity is further reduced since the data read circuit 330 outputs the cell data using the single data bus DB.

FIFTH EMBODIMENT

Figure 12:
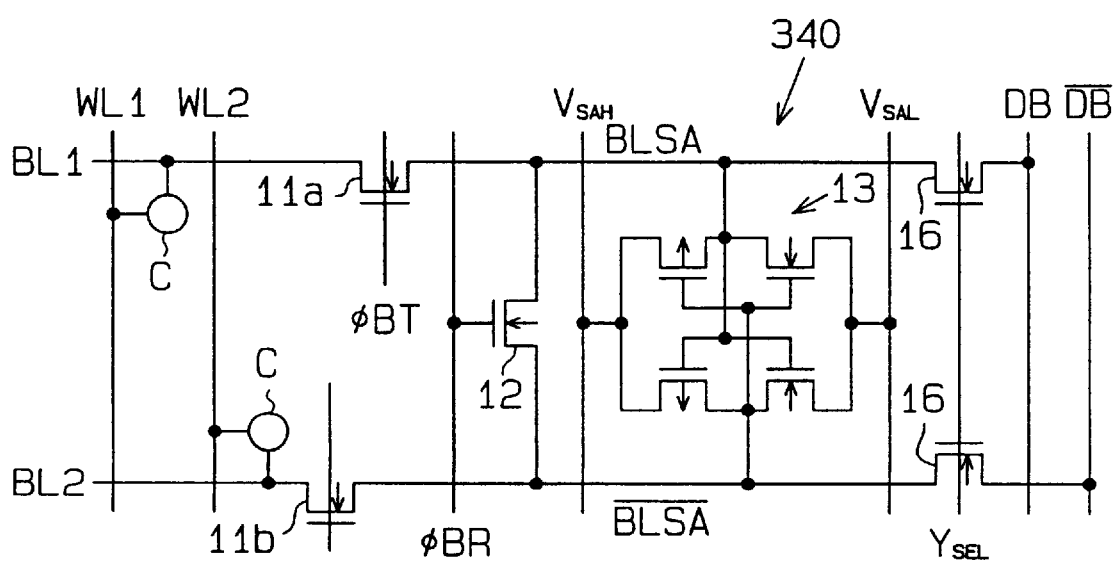
FIG. 12 is a circuit diagram illustrating a data read circuit according to a fifth embodiment.

As shown in FIG. 12, a data read circuit 340 according to a fifth embodiment of the present invention differs from the read circuit 300 of the first embodiment in that the bit line /BLSA is connected to a bit line BL2 via the transfer gate 11b.

The read circuit 340 holds a transfer gate 11b in a noncontinuity state in the read cycle when the bit line BL1 is connected to the bit line BLSA. It also maintains the transfer gate 11a in a noncontinuity state in the read cycle when the bit line BL2 is connected to the bit line /BLSA. Hence, although structurally different, the read circuit 340 operates in the same way as the read circuit 300 of the first embodiment. The read circuit 340 uses a single sense amp 13 per two bit lines. Thus, the number of sense amps required and the circuit area are reduced.

SIXTH EMBODIMENT

Figure 13:
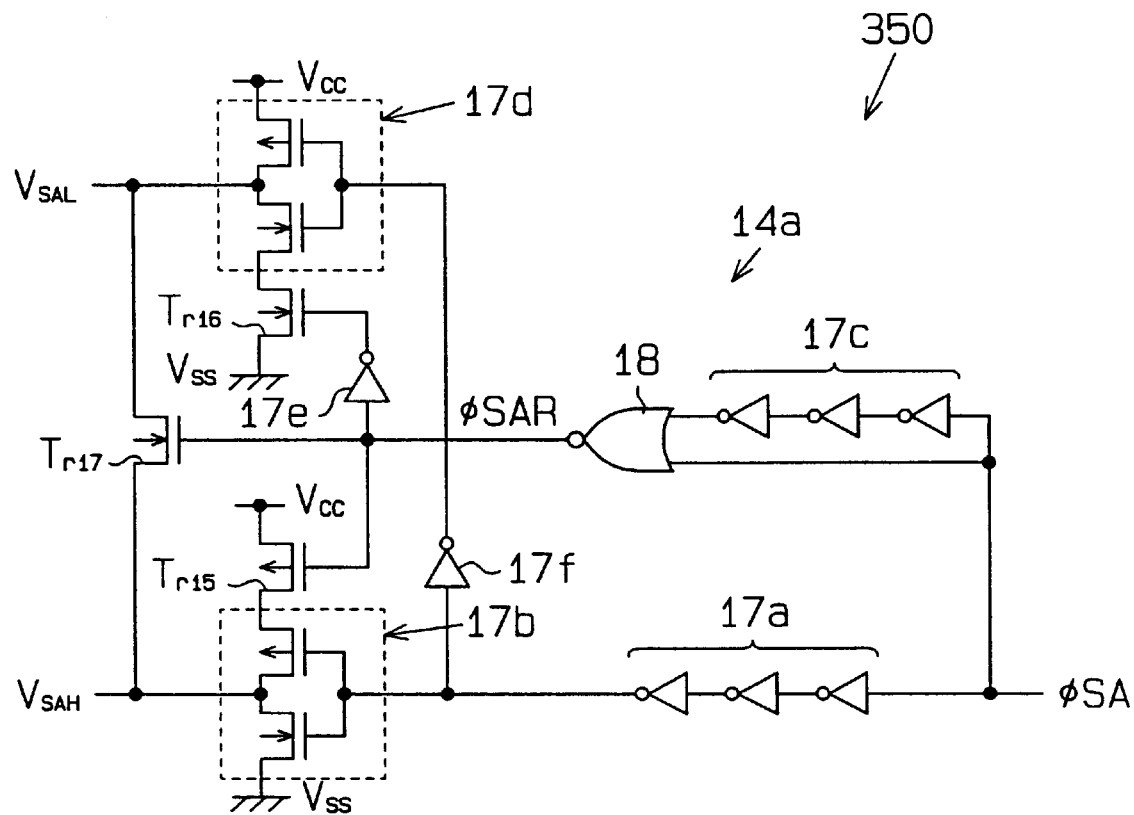
FIG. 13 is a circuit diagram of a power control circuit according to the present invention.

A power control circuit 14a that supplies the activation power supply signals $V_{SAH}$ and $V_{SAL}$ to the sense amp 13 will now be described with reference to FIG. 13. The power control circuit 14a has a three-stage inverter circuit 17a connected to an inverter circuit 17b. The inverter circuit 17a receives the sense amp activation signal φSA and provides the inverter 17b with an inverse signal. A P-channel MOS transistor source of the inverter 17b is connected to the power supply Vcc via a P-channel MOS transistor Tr15. The inverter 17b receives the inverse signal from the inverter 17a and outputs the activation power supply signal $V_{SAH}$.

The inverse signal from the inverter circuit 17a is also provided to an in the inverter circuit 17f and then input to an inverter circuit 17d. An N-channel MOS transistor source of the inverter circuit 17d is connected to the power supply Vss via an N-channel MOS transistor 16. The inverter circuit 17d receives a signal from the inverter circuit 17f and outputs the activation power supply signal $V_{SAL}$.

Figure 14:
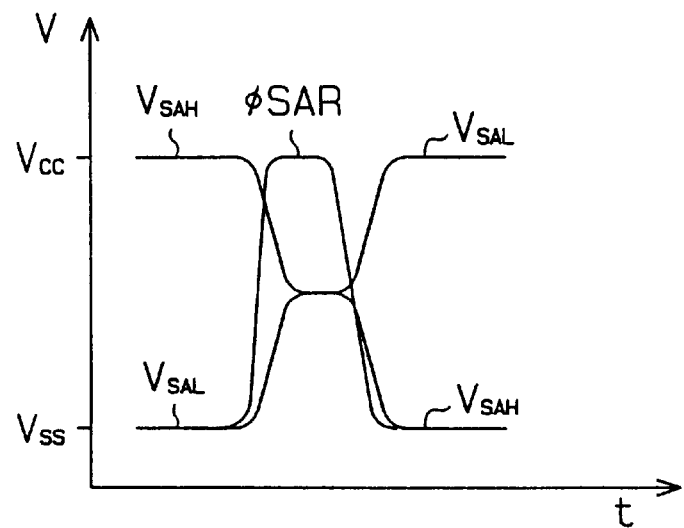
FIG. 14 is a timing chart illustrating the operation of the circuit of FIG. 13.

A NOR circuit 18 and a three-stage inverter circuit 17c also receive the sense amp activation signal φSA. The NOR circuit 18 generates a reset signal φSAR. As shown in FIG. 14, when the activation signal φSA falls, the reset signal φSAR rises and maintains the H-level during the period that corresponds to the operation delay time of the inverter 17c.

The reset signal φSAR is input to the gate of the transistor Tr15 and input to the gate of the transistor Tr16 via an inverter circuit 17e. Accordingly, when the reset signal φSAR is set to the H-level, the transistors Tr15 and Tr16 are turned off and the inverter circuits 17b and 17d are deactivated. On the contrary, when the reset signal φSAR is set to the L-level, the transistors Tr15 and Tr16 are turned on and the inverter circuits 17b and 17d are activated.

An N-channel MOS transistor Tr17 is connected between the output terminal of the inverter circuits 17b and 17d. The transistor Tr17 has a gate which receives the reset signal φSAR. Accordingly, when the reset signal φSAR is set to the H-level, the transistor 17 is turned on and the output terminals of the inverter circuits 17b and 17d enter a short-circuited state.

When the sense amp activation signal φSA has the H-level during the read operation of the cell data, the reset signal φSAR is set to the L-level and the transistors Tr15 and Tr16 are turned on, then the inverter circuits 17b and 17d are activated. Hence, the activation power supply signal $V_{SAH}$ having the power supply Vcc level is output from the inverter circuit 17b, the activation power supply signal $V_{SAL}$ having the power supply Vss level is output from the inverter circuit 17d, and the sense amp 13 is activated.

When the single-cycle read operation terminates, the reset signal φSAR is maintained at the H-level for a predetermined time in response to the trailing edge of the sense amp activation signal φSA in order to deactivate the sense amp 13. The transistors Tr15 and Tr16 are turned off by the reset signal φSAR having the H-level and the inverter circuits 17b and 17d are deactivated. Further, the transistor Tr17 is turned on and the section between the output terminals of the inverter circuits 17b and 17d is short-circuited.

Then, the electric charge stored in the wirings between the output terminals of the inverter circuits 17b and 17d, and the sense amp 13 is uniformly distributed and the activation power supply signals $V_{SAH}$ and $V_{SAL}$ are set to the Vcc/2 level (see FIG. 14). Accordingly, the sense amp 13 is deactivated and the output terminal of the sense amp 13 is set to a high impedance. As a result, the bit lines BL, BLSA and /BLSA are not affected by the output signal of the sense amp 13.

When the reset signal φSAR falls to the L-level, the transistor Tr17 is turned off. Substantially at the same time, the input signal of the inverter 17b is set to the H-level and the input signal of the inverter circuit 17d is set to the L-level. Then, the activation power supply signal $V_{SAH}$ is set to the power supply Vss level, the activation power supply signal $V_{SAL}$ is set to the power supply Vcc level, and the output terminal of the sense amp 13 is maintained at a high impedance.

As described above, when the sense amp 13 is deactivated, the power control circuit 14a first sets each wiring to the Vcc/2 level using the electric charge stored in each wiring that maintains the voltages at the power supply Vcc and power supply Vss levels. To completely deactivate the sense amp 13, the charging operation for raising a power supply wiring from the Vcc/2 level to the Vcc level and the discharging operation for lowering the power supply wiring from the Vcc/2 level to the Vss level are performed. Accordingly, the amounts of charging and discharging electric loads are reduced, thereby reducing current consumption.

SEVENTH EMBODIMENT

Figure 15:
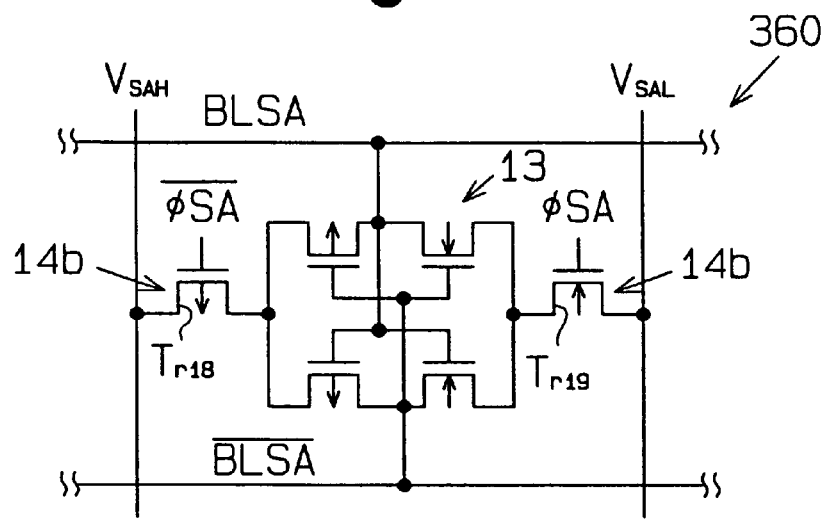
FIG. 15 is a circuit diagram illustrating another embodiment of a power control circuit in accordance with the present invention.

FIG. 15 shows another embodiment of a power control circuit that supplies the activation power supply signals $V_{SAH}$ and $V_{SAL}$ to the sense amp 13. As shown in FIG. 15, the power control circuit 14b includes a P-channel MOS transistor Tr18 and an N-channel MOS transistor Tr19. The transistor Tr18 has a source that always receives the activation power supply signal $V_{SAH}$ having the power supply Vcc level, a drain connected to the P-channel MOS transistor source of the sense amp 13, and a gate for receiving the inverse signal /φSA of the activation signal φSA.

The transistor Tr19 has a source that always receives the activation power supply signal $V_{SAL}$ having the power supply Vss level, a drain connected to the N-channel MOS transistor source of the sense amp 13, and a gate that receives the activation signal φSA.

Figure 16:
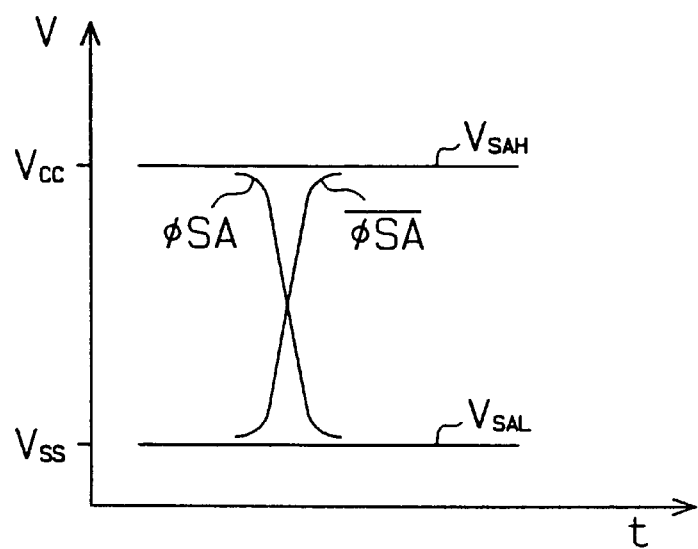
FIG. 16 is a timing chart illustrating the operation of the circuit of FIG. 15.

As shown in FIG. 16, when the sense amp activation signal φSA is set to the H-level, the transistors Tr18 and Tr19 are turned on, the activation power supply signals $V_{SAH}$ and $V_{SAL}$ are supplied to the sense amp 13, and the sense amp 13 is activated.

On the other hand, when the sense amp activation signal φSA is set to the L-level, the transistors Tr18 and Tr19 are turned off, the supply of activation power supply signals $V_{SAH}$ and $V_{SAL}$ is stopped, and the sense amp 13 is deactivated.

In this way, because the sense amp 13 is selectively activated and deactivated by selectively turning on and off the transistors Tr18 and Tr19, the requirement for the charging current and the discharging current are greatly decreased. Accordingly, the power consumption of the power control circuit 14b is reduced.

EIGHTH EMBODIMENT

Figure 17:
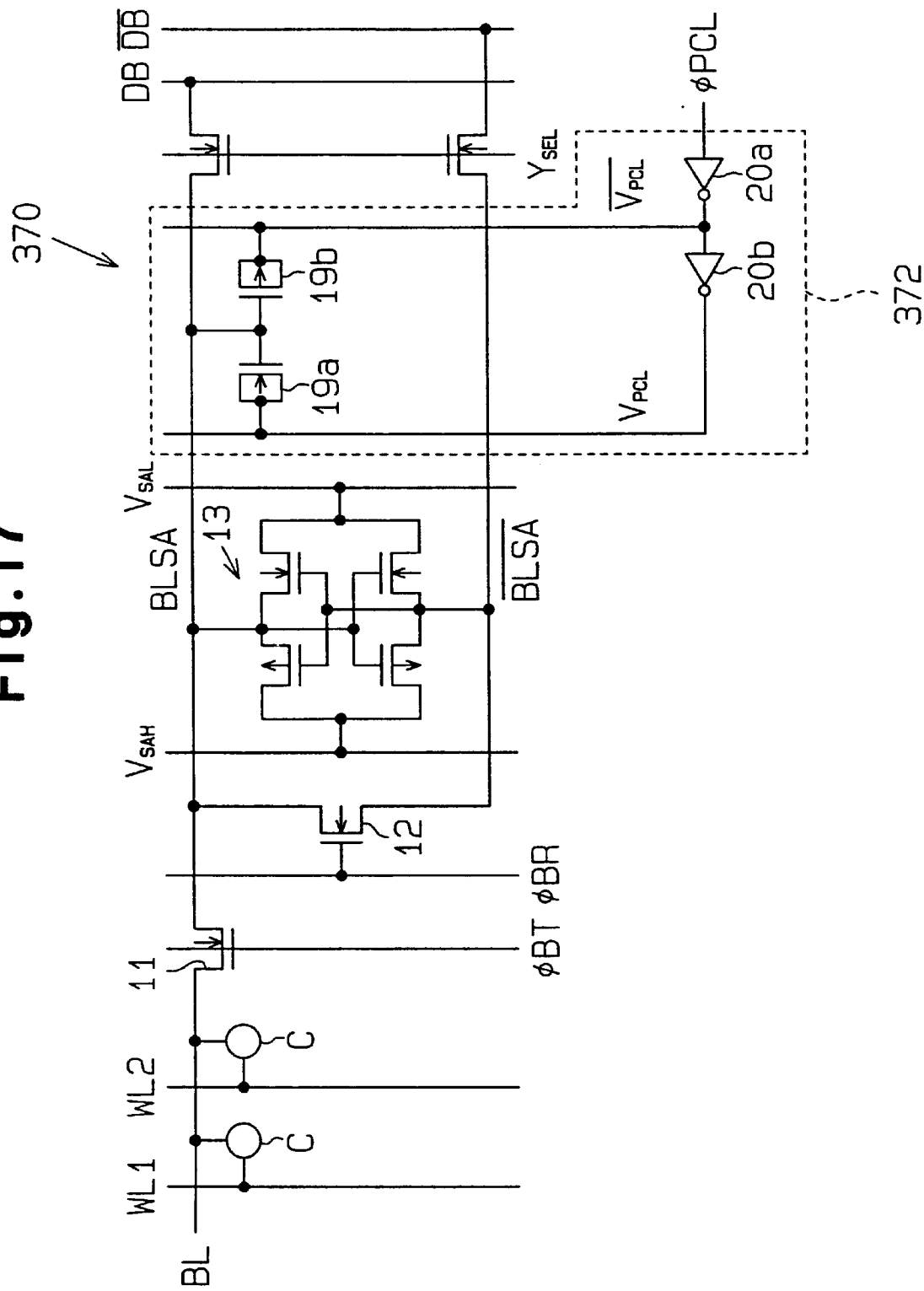
FIG. 17 is a circuit diagram illustrating a data read circuit according to an eighth embodiment.

FIG. 17 shows a data read circuit 370 according to an eighth embodiment of the present invention. The data read circuit 370 comprises an enhancing circuit 372, which enhances the cell data read to the bit line BLSA and improves the read speed, in addition to the read circuit 300 of the first embodiment.

The enhancing circuit 372 includes a capacitor 19a comprising an N-channel MOS transistor, the capacitor 19b comprising a P-channel MOS transistor, and inverter circuits 20a and 20b that control the capacitors 19a and 19b, respectively.

The inverter circuit 20a receives a control signal φPCL and sends an inverse signal /V$_{PCL}$ to the source of the capacitor 19b. The inverter circuit 20b receives the inverse signal /V$_{PCL}$ from the inverter circuit 20a and sends a signal V$_{PCL}$ (control signal φPCL) to the drain of the capacitor 19a. Both the gates of the capacitors 19a and 19b are connected to the bit line BLSA. Herein, the control signal φPCL is a signal that rises to the H-level synchronizing with the leading edge of the sense activation signal φSA and is generated by an internal signal generator (not illustrated).

Figure 18:
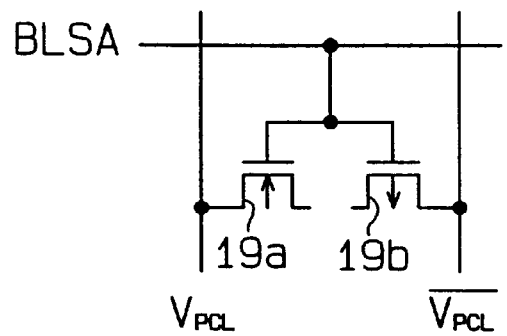
FIG. 18 is a circuit diagram illustrating a part of the data read circuit according to the eighth embodiment.

As shown in FIG. 18, the source of the capacitor 19a (N-channel MOS transistor) and the drain of the capacitor 19b (P-channel MOS transistor) are open without being connected to another wiring or element.

Figure 19:
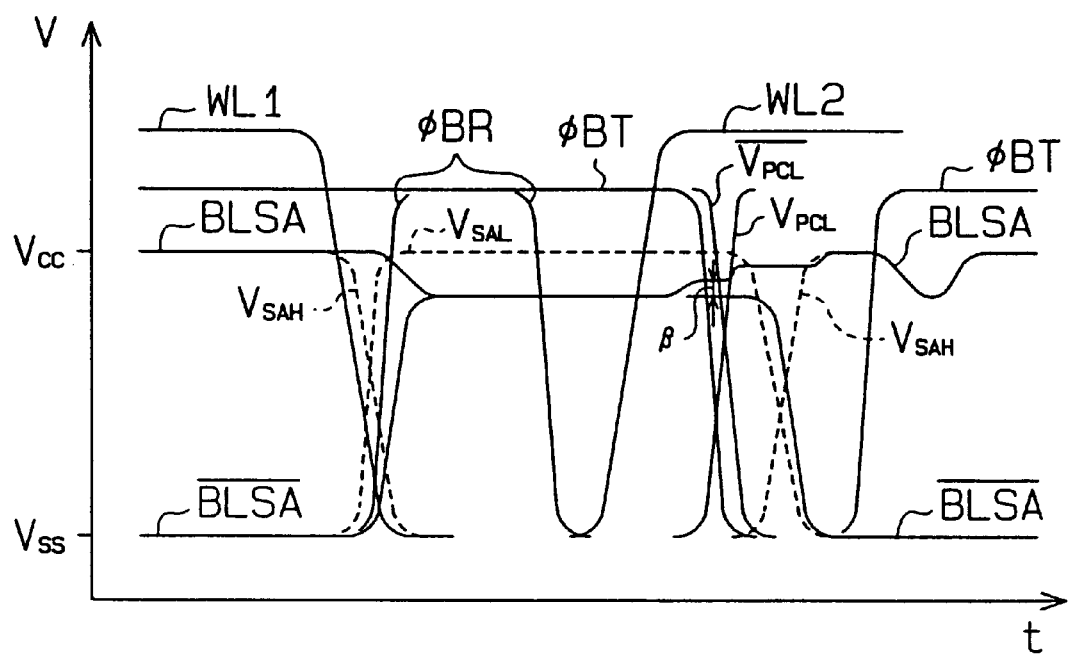
FIG. 19 is a first timing chart illustrating the operation of the circuit according to the eighth embodiment.

The operation of the enhancing circuit 372 will now be described with reference to FIGS. 19 and 20. As shown in FIG. 19, the operation is described when the data having the H-level is read to the bit line BLSA in the preceding cycle and the cell data having the H-level is read to the bit line BLSA in the current cycle. In this case, the bit line BLSA is precharged to a slightly lower level than the power supply Vcc and the cell data having the H-level is read the precharge level.

At this time, because the potential difference between the cell data stored in the memory cell C and the precharge level of the bit line BLSA is small, the potential difference β between the bit line BLSA and the bit line /BLSA is small.

In this state, in response to the leading edge of the control signal φPCL, the output signal /$V_{PCL}$ of the inverter circuit 20a falls to the L-level and the output signal $V_{PCL}$ of the inverter circuit 20a rises to the H-level. Then, the capacitor 19b is turned off and the capacitor 19a is turned on, and then the gate potential of the capacitor 19a (the potential of the bit line BLSA) is raised due to the capacity coupling between the drain and the gate. As a result, the potential difference β between the bit lines BLSA and /BLSA is increased. Subsequently, in response to the activation of the sense amp 13, the potential difference between the lines BLSA and /BLSA increases suddenly and the cell data having the H-level is output.

Besides, as shown in FIG. 6, even when the cell data having the H-level is read to the bit line BLSA in the preceding cycle and the cell data having the L-level is read to the bit line BLSA in the current cycle, the potential of the bit line BLSA is raised in response to the control signal φPCL. However, in this case, because the potential difference between the cell data stored in the memory cell C and the precharge level of the bit line BLSA is comparatively large, the potential difference γ between the bit lines BLSA and /BLSA is larger than the potential difference β described above. Accordingly, even if the potential of the bit line /BLSA is slightly raised from this state, the potential difference between the bit lines BLSA and /BLSA is maintained and the sense amp 13 operates at high speed.

Figure 20:
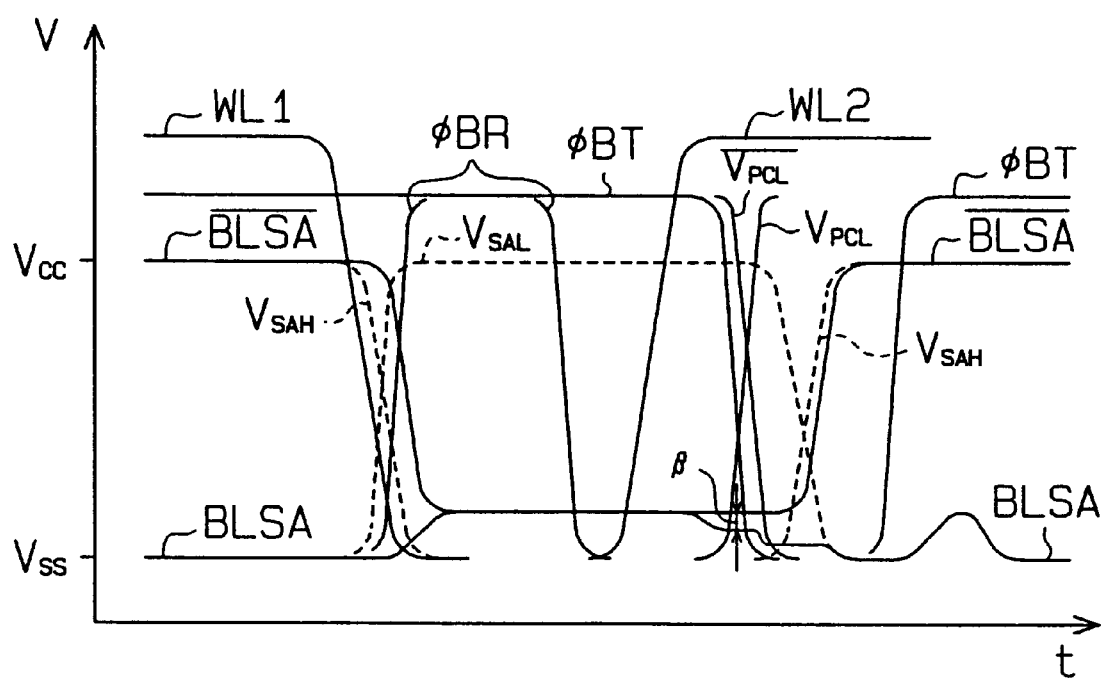
FIG. 20 is a second timing chart illustrating the operation of the circuit according to the eighth embodiment.

As shown in FIG. 20, the operation is described when the data having the L-level is read to the bit line BLSA in the preceding cycle and the cell data having the L-level is read to the bit line BLSA in the current cycle. In this case, the bit line BLSA is precharged to a slightly higher level than the power supply Vss and the cell data having the L-level is read to the precharge level.

At this time, because the potential difference between the cell data stored in the memory cell C and the precharge level of the bit line BLSA is small, the potential difference β between the bit line BLSA and the bit line /BLSA is small.

In this state, in response to the leading edge of the control signal φPCL, the output signal /$V_{PCL}$ of the inverter circuit 20a falls to the L-level and the output signal $V_{PCL}$ of the inverter circuit 20a rises to the H-level. Then, the capacitor 19b is turned off and the capacitor 19a is turned on, and then the gate potential of the capacitor 19a (the potential of the bit line BLSA) is lowered due to the capacitive coupling between the drain and the gate. As a result, the potential difference β between the bit lines BLSA and /BLSA is increased. Subsequently, in response to the activation of the sense amp 13, the potential difference between the lines BLSA and /BLSA increases suddenly and the cell data having the H-level is output.

Besides, as shown in FIG. 7, even when the cell data having the L-level is read to the bit line BLSA in the preceding cycle and the cell data having the H-level is read to the bit line BLSA in the current cycle, the potential of the bit line BLSA is lowered based on the control signal φPCL. However, in this case, because the potential difference between the cell data stored in the memory cell C and the precharge level of the bit line BLSA is comparatively large, the potential difference γ between the bit lines BLSA and /BLSA is larger than the potential difference β described above. Accordingly, even if the potential of the bit line BLSA is slightly lowered from this state, the potential difference between the bit lines BLSA and /BLSA is maintained and the sense amp 13 operates at high speed.

As described above, in the read circuit 370, when the potential difference between the precharge level of the bit line BLSA and the cell data stored in the memory cell C is small (the potential difference of the bit lines BLSA and /BLSA from which the cell data was read is small), the potential difference between the bit lines BLSA and /BLSA is increased by the operation of the enhancing circuit 372. Accordingly, high-speed operation of the sense amp 13 and high-speed read of the cell data are enabled.

NINTH EMBODIMENT

In a DRAM comprising the read circuit of each embodiment described above, when the cell data is read to the bit line BLSA in succeeding read cycles, the power consumption is reduced since the potential difference between the level of the read data output to the bit line BLSA from the sense amp 13 and a precharge level of the bit line BLSA is small.

Figure 21:
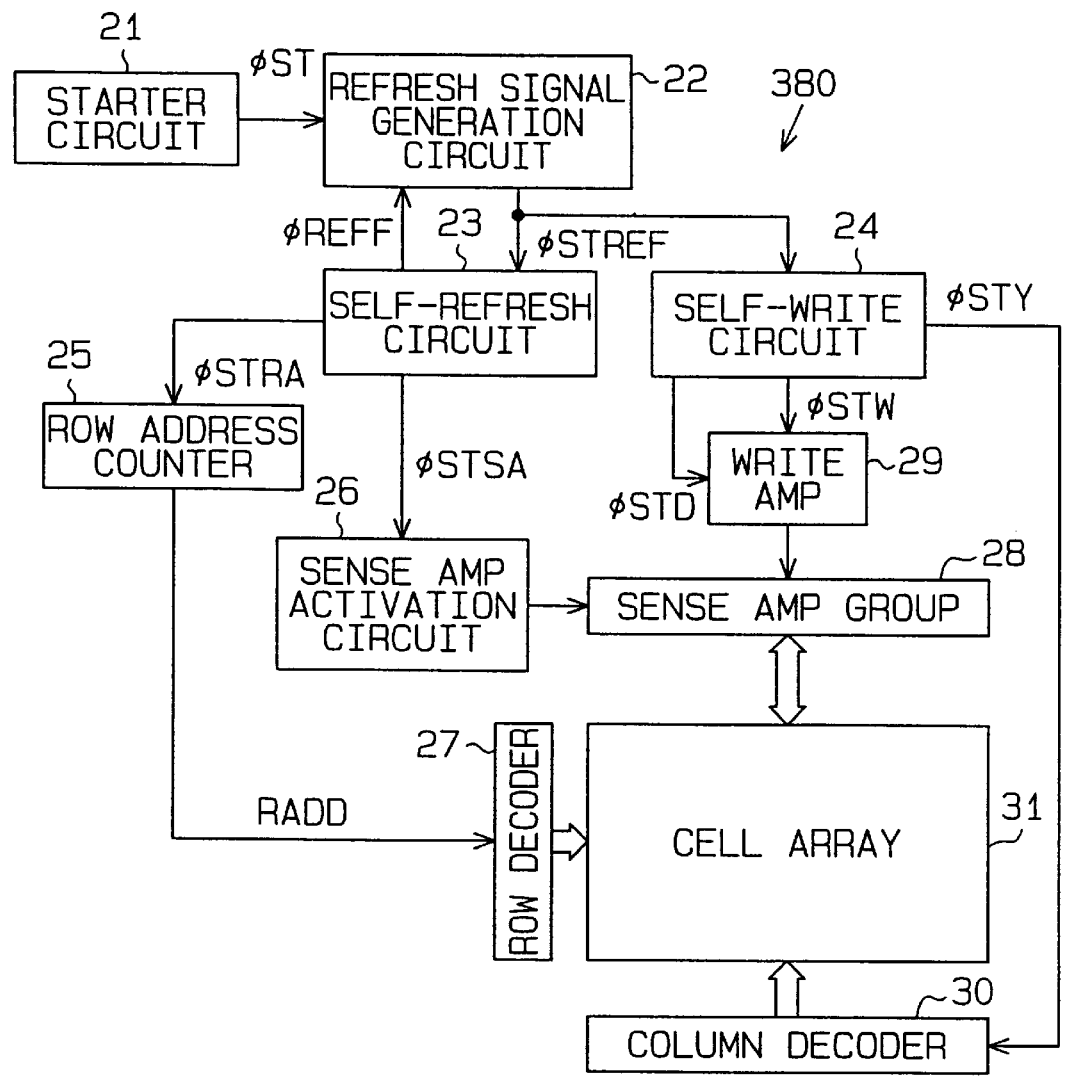
FIG. 21 is a schematic block diagram illustrating a data read circuit according to a ninth embodiment.

Referring now to FIG. 21, a DRAM 380 of the ninth embodiment is provided with an automatic write circuit that reduces the power consumption using the self-refresh operation of a memory cell in the unused area within a cell array by automatically writing the cell data to each memory cell in the cell array when the DRAM 380 has a power switch turned on. The automatic write circuit comprises a starter circuit 21, a refresh signal generation circuit 22, a self-refresh circuit 23, a self-write circuit 24, a row address counter 25, a sense amp activation circuit 26, a row decoder 27, a sense amp group 28, a write amp 29, and a column decoder 30.

Figure 22:
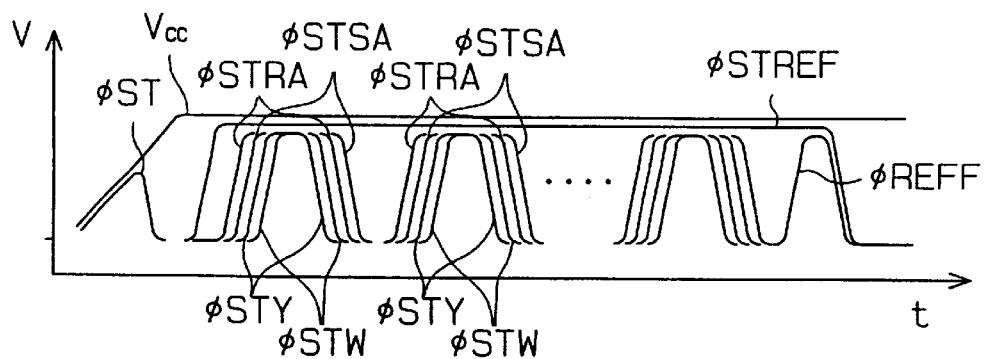
FIG. 22 is a timing chart illustrating the operation of the circuit of FIG. 21.

The starter circuit 21 sends a starter signal φST to the refresh signal generation circuit 22 when the power supply Vcc is applied. The starter signal φST, as shown in FIG. 22, falls to the L-level when the power supply Vcc reaches a predetermined level.

The refresh signal generation circuit 22 sends a self-refresh signal φSTREF to the self-refresh circuit 23 and the self-write circuit 24 in response to the starter signal φST. The self-refresh circuit 23 is activated in response to the self-refresh signal φSTREF and sends a count signal φSTRA to the row address counter 25 and an activation signal φSTSA to the sense amp activation circuit 26. The count signal φSTRA and the activation signal φSTSA are, as shown in FIG. 22, pulse signals with fixed cycles.

The row address counter 25 counts the count signal φSTRA and sends a row address signal RADD to the row decoder 27 corresponding to the counted value. The sense amp activation circuit 26 supplies an activation power supply signal to the sense amp group 28 in response to the activation signal φSTSA.

The self-write circuit 24 is activated in response to the self-refresh signal φSTREF and sends a write amp activation φSTW and write data φSTD to the write amp 29.

The write amp activation signal φSTW is a pulse signal that synchronizes with the activation signal φSTSA and the write data φSTD has a fixed level that is either at the H-level or L-level.

The self-write circuit 24 sends a column select signal φSTY that synchronizes with the write amp activation signal φSTW to the column decoder 30. The row decoder 27 and the column decoder 30 are used to select the memory cell within the cell array 31.

The self-refresh circuit 23 sends a termination signal φREFF to the refresh signal generation circuit 22 after a predetermined time has elapsed after receiving the self-refresh signal φSTREF. The refresh signal generation circuit 22, as shown in FIG. 22, lowers the self-refresh signal φSTREF to the L-level in response to the termination signal φREFF and terminates the automatic write operation.

The DRAM 380 sequentially outputs the row address signal RADD from the row address counter 25 in response to the power supply being turned on and sequentially outputs the word line within the cell array 31 in response to the row address signal RADD. Synchronizing with the selection of the word line, the column gate is selected and the sense amp group 28 and the write amp 29 are activated. The data is sequentially written in each memory cell connected to the selected word line.

By such operation, the cell data is written in the memory cell within the cell array 31 when the power switch is turned on. In the self-refresh operation after writing, the cell data is read to each bit line BLSA in the unused area of the cell array in the succeeding read cycle. Thus, the potential difference between the level of the data read from the sense amp to the bit line BLSA and the precharge line BLSA is reduced and the power consumption is greatly reduced.

In addition, the area in which the same cell data is written in the cell array can be previously set. In this case, the same data is written according to the control signal output from an external controller that controls the write and the read operation of the DRAM 380. Otherwise, the same cell data can also be written to the memory cell that is connected to the same bit line and in which the refresh operation is performed, prior to the normal refresh operation and the refresh operation that follows an externally input address signal as well as the self-refresh operation.

In each embodiment described above, the precharge operation of the bit line is performed in response to the precharge signal that rises to the H-level immediately after the word line has been selected. However, the precharge operation can be performed by activating the precharge signal to the H-level in response to the start of the read operation in the next cycle. In this case, because the precharge operation is performed as required when the time from the current cycle to the next cycle is long, the unnecessary precharge operation is prevented and the power consumption is reduced.

When the sense amp group 28 is simultaneously activated as described above to perform the automatic write operation, power noise is generated and a malfunction may occur. In this case, it is desirable that the power noise be reduced by dividing the cell array 31 into multiple blocks, gradually activating the sense amp group of each block at the predetermined time difference or restricting the current supply performance of activation power at the leading edge of the sense amp activation signal φSTSA.

TENTH EMBODIMENT

In a general DRAM, although the cell data read based on the address input in the preceding cycle is maintained in the sense amp, the read operation is performed again in the same way as the preceding cycle when the same address is input in the current cycle. Accordingly, although the same cell data as the preceding cycle is output, the address is input, and it takes much time to read the sense data after the address has been entered.

A DRAM with the read circuit of one of the aforedescribed embodiment may comprise a circuit for improving the data read speed. The circuit stores the address entered in the preceding cycle in a register, and then reads the cell data in the preceding cycle held in the sense amplifier as the cell data in the current cycle when the same address is entered in the current cycle.

Figure 23:
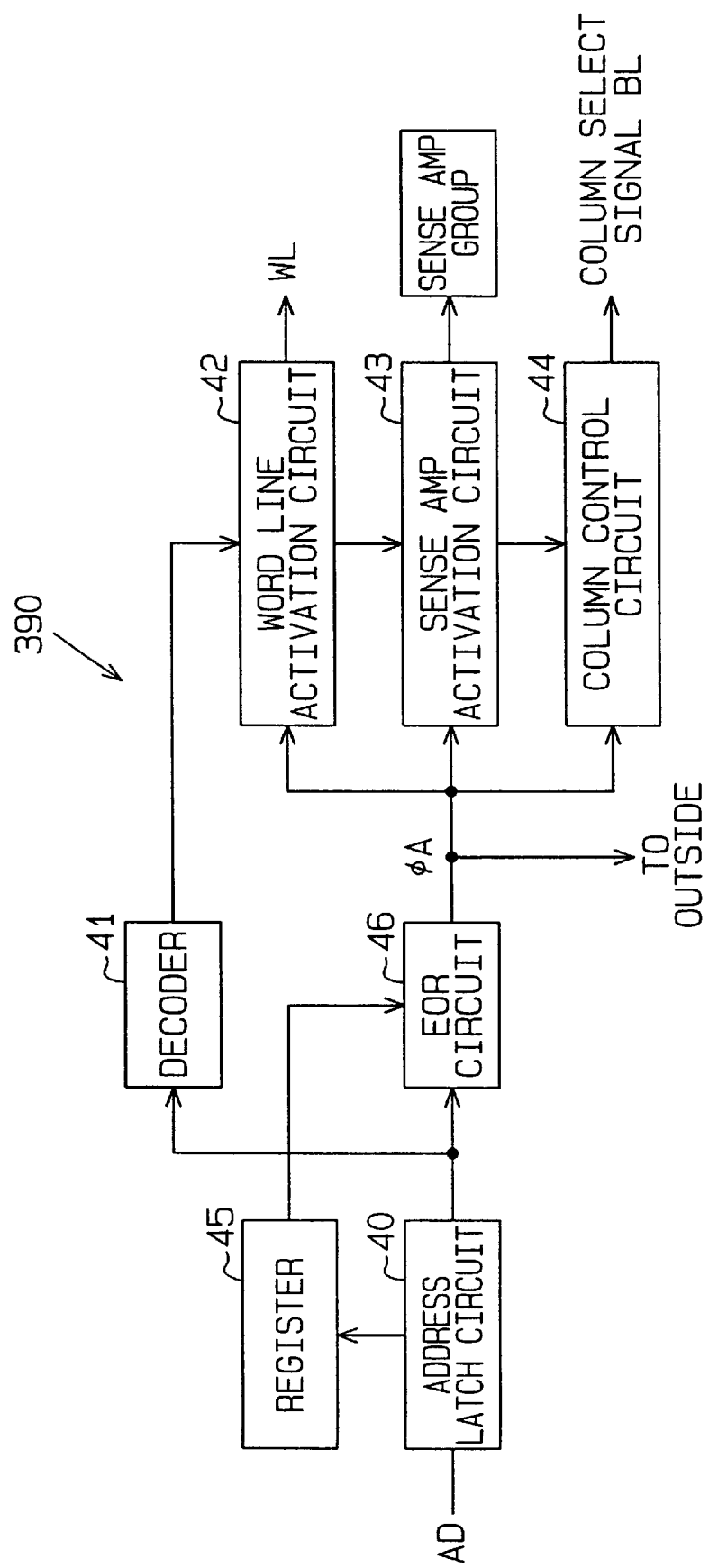
FIG. 23 is a schematic block diagram illustrating a data read circuit according to a tenth embodiment.

FIG. 23 shows a circuit 390 in accordance with a tenth embodiment of the present invention. As shown in FIG. 23, a address latch circuit 40 receives the address signal AD from an external circuit and sends the address signal AD to a decoder 41, a register 45, and an EOR circuit 46 (exclusive-OR).

The decoder 41 sends a word line select signal to a word line activation circuit 42 in response to the address signal AD. The word line activation circuit 42 selects the predetermined word line WL within the cell array in response to the word line select signal. A sense amp activation circuit 43 resets the sense amp that maintained the cell data in the preceding cycle in response to the input of the address signal AD and activates the sense amp after the predetermined time has elapsed from the time when the word line WL has been selected.

When a sense amp is activated, the sense amp holds the cell data according to the address signal AD in the current cycle. After the sense amp has been activated and the predetermined time has elapsed, a column control circuit 44 outputs a column select signal, selects the predetermined bit line, and outputs the cell data maintained in the sense amp to the data bus.

The register 45 temporarily stores the address signal AD from the address latch circuit 40 up to the next cycle. The register 45 sends the address signal AD stored in the preceding cycle to the EOR circuit 46 in response to the input of the address signal AD in the current cycle.

The EOR circuit 46 detects whether the address signal AD in the current cycle from the address latch circuit 40 matches the address signal AD of the preceding cycle from the register 45. When the address matching is detected, the EOR circuit 46 generates a match detection signal φA to the word line activation circuit 42, sense amp activation circuit 43, column control circuit 44 and an external circuit (not illustrated).

When the address signal AD in the current cycle and the address signal AD in the preceding cycle match and the matching detection signal φA is input to circuits 42 to 44, the word line activation circuit 42 is deactivated. The sense amp activation circuit 43 performs the reset operation of the sense amp that maintained the cell data of the preceding cycle. The column control circuit 44 accelerates the output timing of the column select signal and outputs the cell data of the preceding cycle held in the sense amp to the data bus as the cell data of the current cycle. Accordingly, when the address signal AD in the preceding and current cycles is the same, the cell data read is shortened.

ELEVENTH EMBODIMENT

Figure 24:
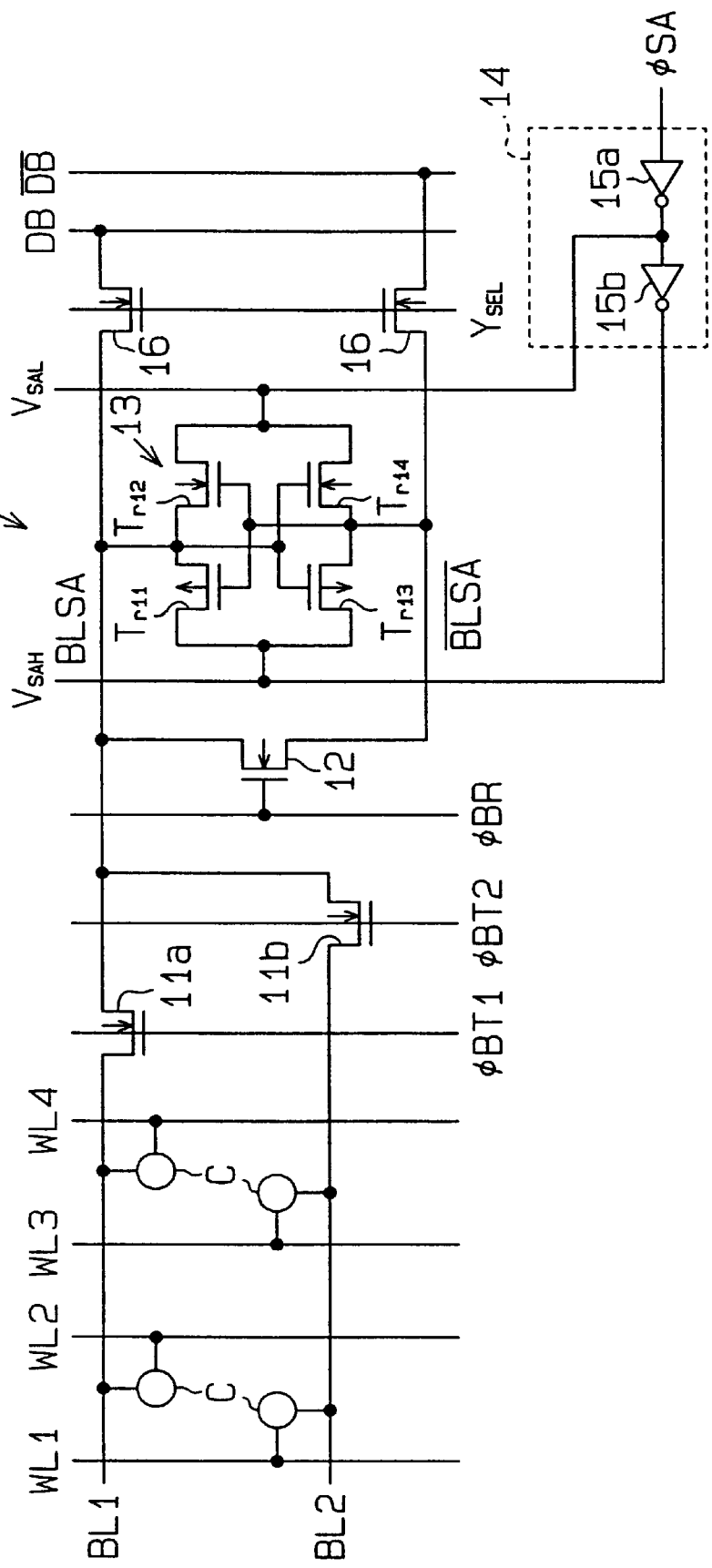
FIG. 24 is a circuit diagram illustrating a data read circuit according to an eleventh embodiment.

As shown in FIG. 24, in a read circuit 400 of an eleventh embodiment, two bit lines BL1 and BL2 are connected to the sense amp 13 via the transfer gates 11a and 11b, respectively. A plurality of memory cells C are connected to the bit lines BL1 and BL2 and the four word lines WL1 to WL4, as shown.

Figure 25A:
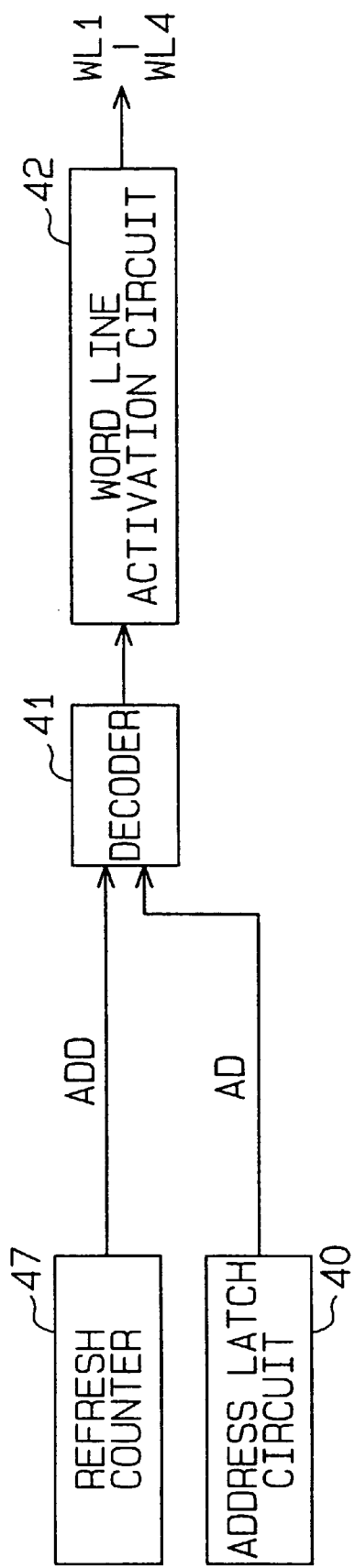
FIGS. 25 (a) and (b) are schematic block diagrams illustrating the data read circuit according to the eleventh embodiment.
Figure 25B:
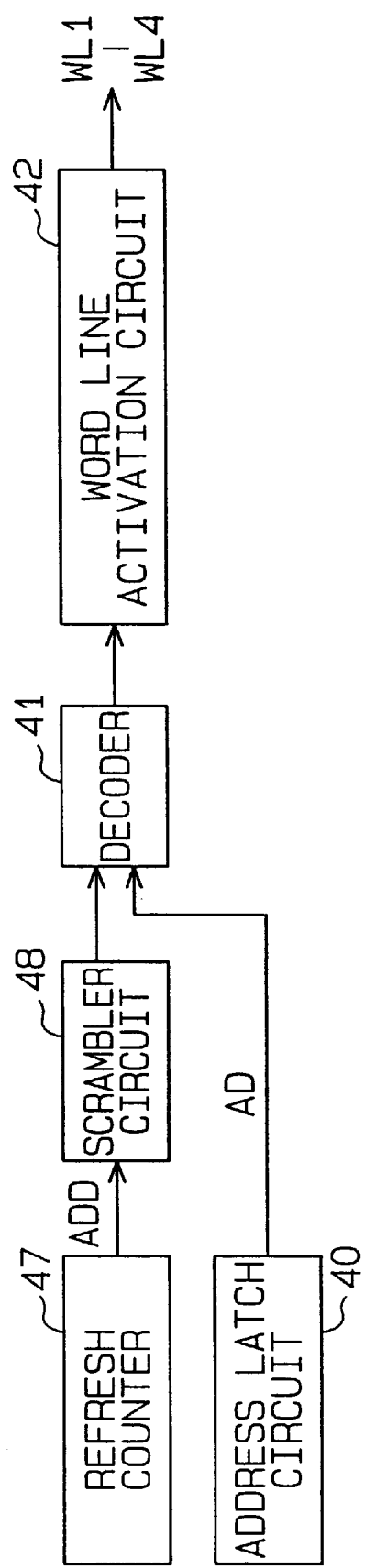

As shown in FIG. 25 (a), each word line WL1 to WL4 is connected to the word line activation circuit 42 in the same way as in FIG. 23. The word line activation circuit 42 selects one of the word lines WL1 to WL4 according to the word line select signal generated by the decoder 41 based on the address signal AD from the address latch circuit 42.

The decoder 41 also receives an address signal ADD from a refresh counter 47. During a refresh operation (rewrite operation), the decoder 41 generates a word line selection signal according to the address signal ADD from the refresh counter 47. One of the bit lines BL1 and BL2, to which the predetermined memory cell C is connected, is connected to the sense amp 13 according to the bit line select signals φBT1 and φBT2, and the sense amp 13 refreshes (rewrites) the selected memory cell.

When one of the bit lines BL1 and BL2 is selected, the other bit line BL1 or BL2 is in a floating state. When the floating state continues for a long time, the data stored in the memory cell C leak and the data may be changed. Therefore, the DRAM alternately selects the bit lines BL1 and BL2 during the refresh operation to shorten the floating time of each bit line. This alternate selection is achieved by allowing the refresh counter 47 to generate the address signal ADD so that the word line can be selected in the order of WL1, WL2, WL3 and WL4, for example.

As shown in FIG. 25 (b), a scrambler circuit 48 can also be connected between the refresh counter 47 and the decoder 41. The scrambler circuit 48 converts the order of the address signal ADD so that the word line is selected in the order of WL1, WL2, WL3 and WL4, for example, in the same way as above and sends the address signal to the decoder 41 in the converted order.

In the eleventh embodiment, each bit line BL1, BL2 is alternately selected so that the floating time of each bit line BL1, BL2 is reduced. Therefore, the leakage of data stored in the memory cell C is reduced and the integrity of the data is maintained.

TWELFTH EMBODIMENT

As shown in FIG. 26, a data read circuit 420 of a twelfth embodiment employs clamp circuits 49a and 49b instead of the memory cell C in the data read circuit 410 of the eleventh embodiment.

Each of the clamp circuits 49a, 49b is connected to one of the bit lines BL1 and BL2, and clamps the levels of each bit line BL1, BL2 between the power supply signals Vcc and Vss supplied to the sense amp 13 in the floating state. More particularly, each clamp circuit 49a, 49b includes two diodes D1 and D2. The diode D1 has an anode connected to the bit line BL1 (BL2) and a cathode connected to a power supply VPN. The power supply VPN level is lower than that of the power supply Vss only by a threshold Vth of the diode D1. The diode D2 has its cathode connected to the bit line BL1 (BL2) and its anode connected to a power supply VNP. The power supply VNP level is higher than that of the power supply Vss only by a threshold Vth of the diode D2.

Accordingly, when each bit line BL1 and BL2 is in the floating state, because the power supplies VPN and VNP are supplied to the bit lines BL1 and BL2, respectively, the levels of the bit lines BL1 and BL2 are clamped between the power supply Vcc and Vss. As a result, data leakage is prevented.

THIRTEENTH EMBODIMENT

Figure 27:
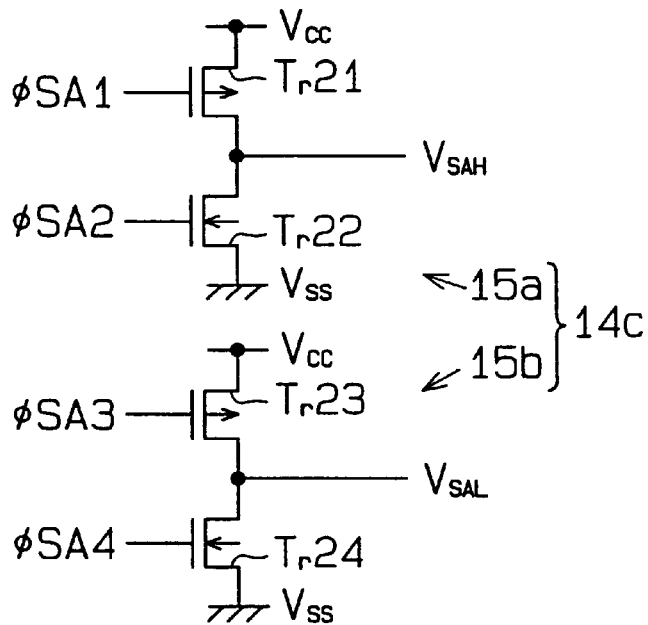
FIG. 27 is a circuit diagram illustrating a data read circuit according to a thirteenth embodiment.

FIG. 27 shows a power control circuit 14c for preventing the generation of through current during transition of the sense amp activation signal φSA. The power control circuit 14c includes an inverter 15a comprising P-channel and N-channel MOS transistors Tr21 and Tr22 and an inverter circuit 15b comprising P-channel and N-channel MOS transistors Tr23 and Tr24. The gates of the transistors Tr21 and Tr22 receive sense amp activation signal φSA1, φSA2, respectively. The gates of the transistors Tr23 and Tr24 receive sense amp activation signal φSA3, φSA4, respectively.

Figure 28:
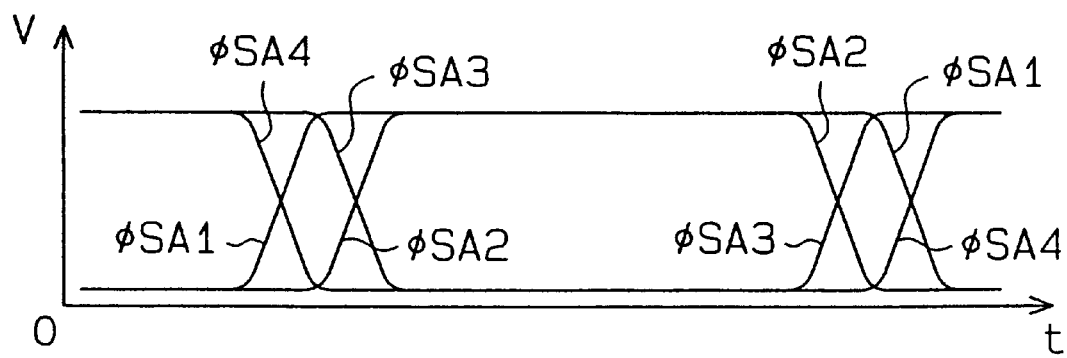
FIG. 28 is a timing chart illustrating the operation of the circuit of FIG. 27.

The sense amp activation signals φSA1 to φSA4 are shifted as shown in FIG. 28. To deactivate the sense amp 13 if the aforedescribed embodiments, first, the sense amp activation signal φSA1 rises and the sense amp activation signal φSA4 falls. Then, when the transistors Tr21 and Tr24 are turned off, at substantially the same time the sense amp activation signal φSA2 falls and the sense amp activation signal φSA3 drops. Subsequently, the transistors Tr22 and Tr23 are turned on. This sequence sets the activation power supply signal $V_{SAH}$ to the L-level and the activation power supply signal $V_{SAL}$ to the H-level.

On the other hand, to activate the sense amp 13, first, the sense amp activation signal φSA2 drops and the sense amp activation φSA3 rises. Subsequently, the transistors Tr22 and Tr23 are turned off. Then, when the transistors Tr22 and Tr23 are turned off, at substantially the same time, the sense amp activation signal φSA1 falls and the sense amp activation signal φSA4 rises. Subsequently, the transistors Tr21 and Tr24 are turned on. This sequence sets the activation power supply signal $V_{SAH}$ to the H-level and the activation power supply signal $V_{SAL}$ to the L-level.

Consequently, according to the power control circuit 14c, when one transistor Tr21 (Tr22) of the inverter 15a is turned on, the other transistor Tr22 (Tr21) is turned off. Similarly, when one transistor Tr23 (Tr24) of the inverter 15b is turned on, the other transistor Tr22 (Tr21) is turned off. Therefore, even if the sense amp activation signals φSA1 to φSA4 are shifted to activate or deactivate the sense amp 13, no through current is generated in the inverter circuits 15a and 15b. As a result, power consumption of the power control circuit 14c is reduced.

FOURTEENTH EMBODIMENT

Figure 31:
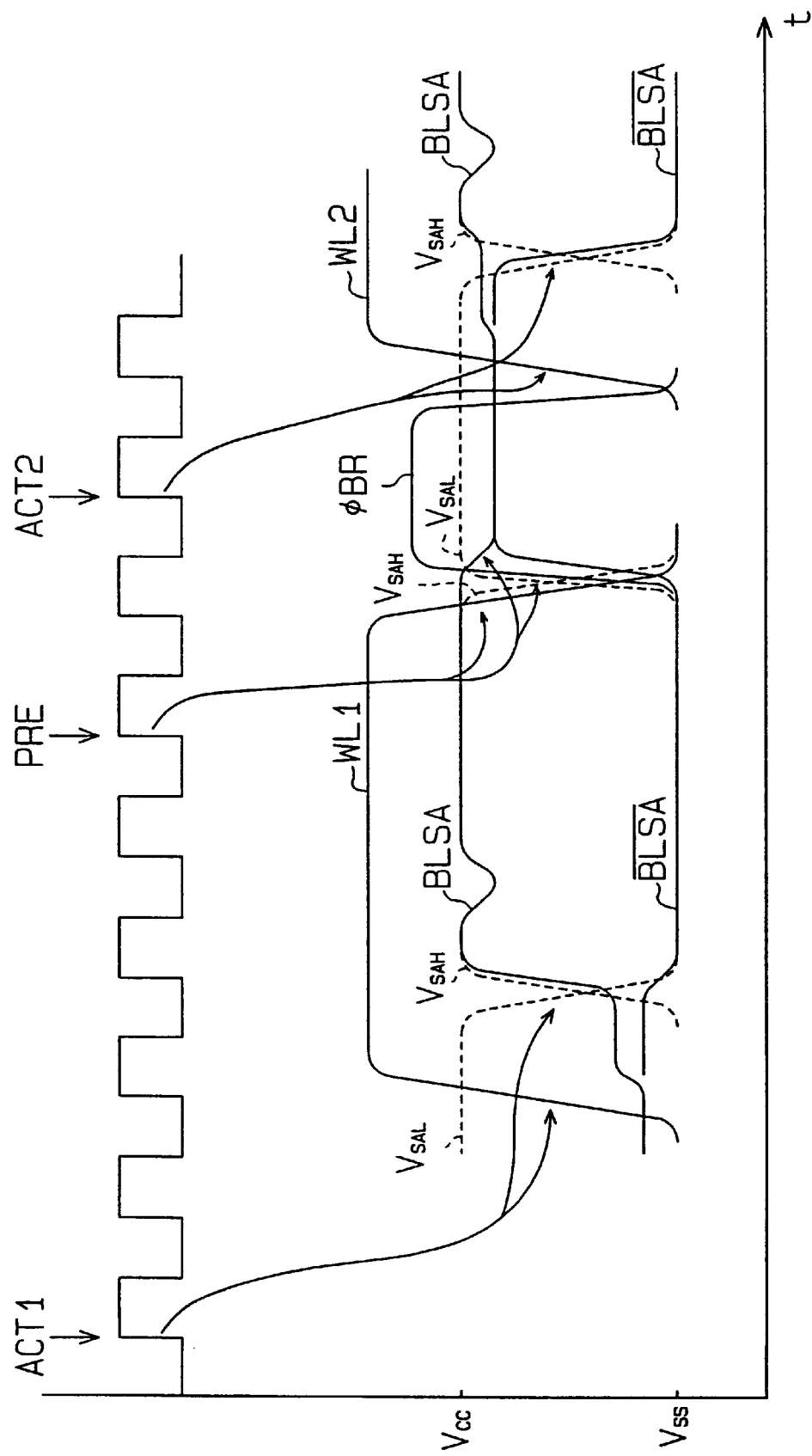
FIG. 31 is a timing chart illustrating the changes of various signals when the data read circuit of each embodiment of the present invention is operated using conventional timing.

FIG. 31 shows the changes of signals when the data read circuit of each embodiment described above operates using the conventional timing. The following is described with reference to the data read circuit 300 of the first embodiment shown in FIG. 4.

According to a read instruction ACT1 in a preceding cycle, for example, the word line WL1 is selected and the cell data having the H-level is output to the bit line BLSA. At this time, the activation power supply signal $V_{SAH}$ of the sense amp 13 is the power supply Vcc and the activation power supply signal $V_{SAL}$ is the power supply Vss, and the sense amp 13 is set in an active state. The cell data output to the bit line BLSA is rewritten to the memory cell C selected via the bit line BL, and subsequently, the cell data output to the bit lines BLSA and /BLSA is transmitted to the data buses DB and /DB.

Then, in response to the precharge instruction PRE, the word line WL1 falls to the L-level. When the activation power supply signal $V_{SAH}$ of the sense amp 13 changes to the power supply Vss level and the activation power supply signal $V_{SAL}$ changes to the power supply Vcc level, the sense amp 13 is deactivated. Further, in response to the precharge signal φBR, the short-circuiting transistor 12 is turned on and the bit lines BLSA and /BLSA are short-circuited.

Subsequently, the potential between the bit line BL or BLSA and the bit line /BLSA are equalized.

Then, in response to a read instruction ACT2 in the current cycle, for example, the word line WL2 is selected and the word line WL2 rises to the H-level. Subsequently, the cell data (H-level in this case) is read from the memory cell C selected by the word line WL2 to the bit line BLSA via the bit line BL.

Then, the transfer gate 11 is turned off and the activation power supply signal $V_{SAH}$ of the sense amp 13 is set to the power supply Vcc level and the activation power supply signal $V_{SAL}$ is set to the power supply Vss level. Subsequently, the sense amp 13 is activated, and the potential difference between the bit lines BLSA and /BLSA is amplified. The bit line BLSA is set to the power supply Vcc level and the bit line /BLSA is set to the power supply Vss level. The cell data output to the bit line BLSA is rewritten to the memory cell selected via the bit line BL. Subsequently, the cell data output to the bit lines BLSA and /BLSA is output to the data buses DB and /DB and this read cycle is terminated.

When the data read circuit operates in the conventional timing in this manner, because the total capacity of the bit lines BL, BLSA, and /BLSA is approximately half that of the conventional bit line, the potential between the bit line BL or BLSA and /BLSA can be equalized in a short time. However, the time required for the equalization is longer than necessary. This is because the equalization of the potential between the bit line BL or BLSA and /BLSA starts in response to the precharge instruction PRE.

Figure 29:
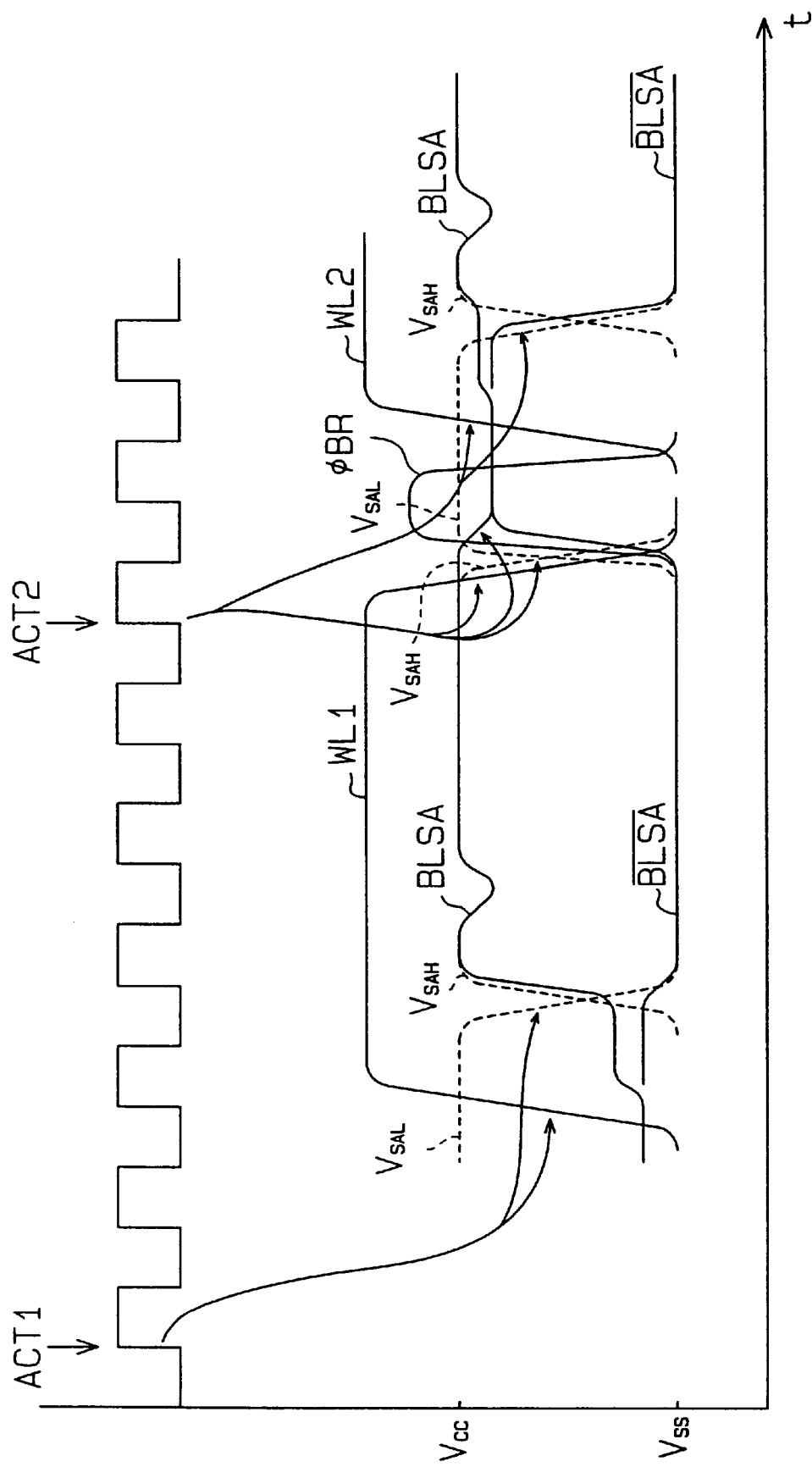
FIGS. 29 and 30 are timing charts illustrating an operation of a data read circuit according to a fourteenth embodiment.

FIG. 29 indicates the changes of the signals when the precharge signal PRE is omitted. The precharge instruction PRE is omitted, and in response to the read instruction ACT2 in the current cycle, the word line WL1 in the preceding cycle falls and the sense amp 13 is deactivated, and the potential between the bit line BL or BLSA and the bit line /BLSA are equalized, respectively.

By doing so, while the potential between the bit line BL or BLSA and the bit line /BLSA are being equalized fully, time is required for equalization of the potential. By delaying the leading edge of the word line WL1 and the deactivation of the sense amp 13 only when the time required for the equalization is reduced, data is accurately rewritten to the memory cell C in the preceding cycle. The data read speed is also increased by accelerating the read operation in the current cycle only when the time required for the equalization is reduced.

Figure 30:
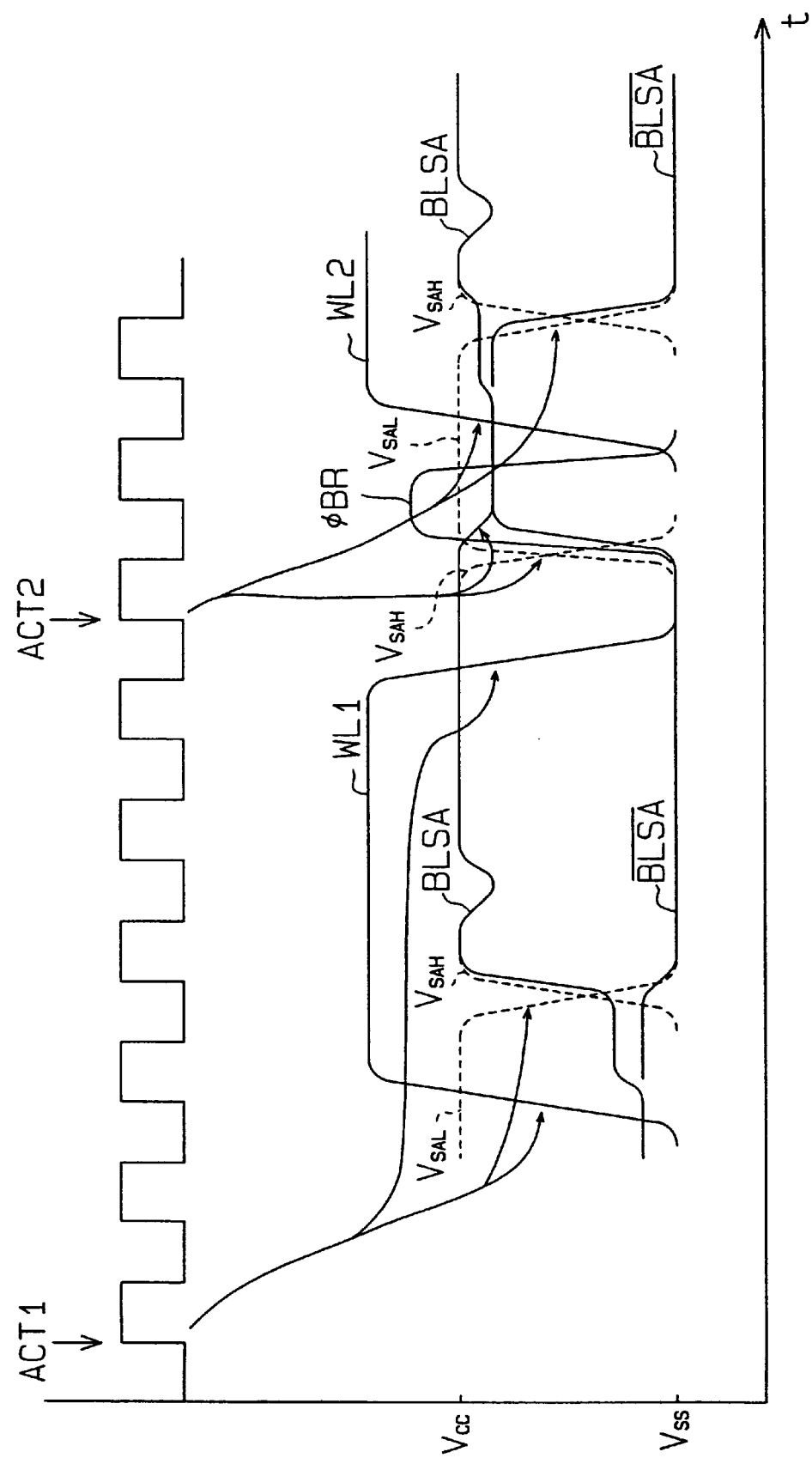

Alternatively, as shown in FIG. 30, the word line WL1 selected according to the read instruction ACT1 in the preceding cycle may fall after the predetermined time from the read instruction ACT1, that is, the time when the data is fully rewritten to the memory cell C has elapsed regardless of the instruction ACT2.

FIFTEENTH EMBODIMENT

Figure 32:
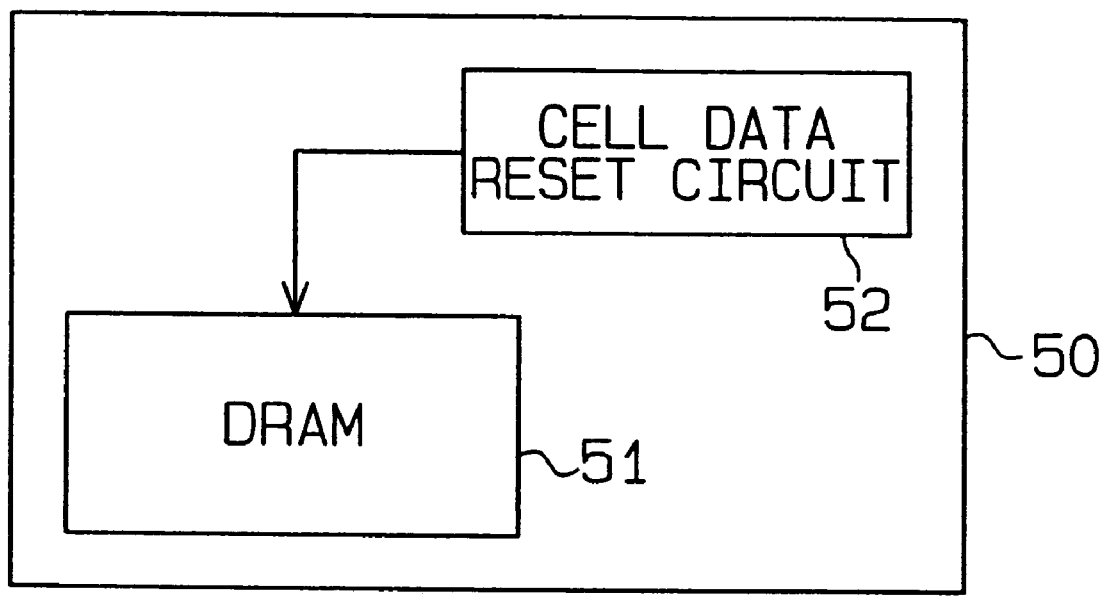
FIG. 32 is a schematic block diagram illustrating a data read circuit according to a fifteenth embodiment.

As shown in FIG. 32, a data storage device 50 has a DRAM 51 comprising the read circuit of each one of the embodiments described above and a self-reset circuit 52 that resets the cell data of the DRAM 51. The cell data reset circuit 52 automatically writes the same data in each memory cell of the area that a program used when the program is terminated and resets the data within the cell array. The cell data reset circuit 52 automatically writes the same data in each memory cell of the cell array when the power is turned on and resets the data within the cell array.

The cell data reset circuit 52 writes the same cell data to the memory cell of the cell array when a program that uses the DRAM 51 has terminated or the DRAM 51 has a power switch turned on. Accordingly, during the subsequent refresh operation, the DRAM 51 reads the same cell data to each bit line in the subsequent read cycles. The potential difference between the read data output from the sense amp to the bit line and the precharge level is reduced. As a result, the power consumption is reduced greatly.

The present examples and embodiments are to be considered as illustrative and not restrictive and the invention is not to be limited to the details given herein, but may be modified within the scope and equivalence of the appended claims.

What is claimed is:

1. A semiconductor memory device comprising:
    a plurality of memory cells for storing data;
    word lines connected to said memory cells;
    a first bit line including a primary bit line connected to said memory cells and a secondary bit line;
    a first switching circuit connected between the primary and secondary bit lines;
    a sense amplifier connected to the secondary bit line;
    a second bit line connected to the sense amplifier; and
    a second switching circuit connected between the second bit line and one of the primary and secondary bit lines.

2. The device according to claim 1, wherein the second switching circuit turns on in response to a precharge signal.

3. The device according to claim 1 further comprising:
    a column gate connected to at least one of the secondary bit line and second bit line; and
    a data bus connected to the column gate for providing the data.

4. The device according to claim 1, wherein a precharge operation is initiated in response to a read instruction for the present cycle.

5. The device according to claim 1, wherein a precharge level of the first and second bit lines is set to a level that is close to one of a high potential power supply level and a low potential power supply level.

6. The device according to claim 5, wherein the first bit line has a capacitance that is greater than that of the second bit line.

7. The device according to claim 1, wherein a precharge level of the first and second bit lines at the present cycle is set by turning on the second switching circuit after the data having a predetermined level is read on the secondary bit line via the primary bit line at the previous cycle by turning on the first switching circuit.

8. The device according to claim 7, wherein the precharge level at the present cycle is set to a level close to a high potential power supply level when the data having a high potential is read at the previous cycle.

9. The device according to claim 7, wherein the precharge level at the present cycle is set to a level close to a low potential power supply level when the data having a low potential is read at the previous cycle.

10. The device according to claim 1 further comprising a power supply control circuit connected to the sense amplifier for supplying a first power supply and a second power supply.

11. The device according to claim 10, wherein the power supply control circuit includes at least one inverter for generating the first and second power supplies.

12. The device according to claim 10, wherein the power supply control circuit inverts the level of the first and second power supplies to set an output terminal of the sense amplifier to a high impedance state during a precharge operation.

13. The device according to claim 12, wherein the power supply control circuit comprises:
   a first pull-up transistor and a first pull-down transistor connected between a high potential power supply and a low potential power supply, for generating the first power supply in response to a sense amplifier activating signal; and
   a second pull-up transistor and a second pull-down transistor connected between the high potential power supply and the low potential power supply, for generating the second power supply in response to the sense amplifier activating signal.

14. The device according to claim 10, wherein the power supply control circuit generates the first and second power supplies having substantially the same potential to set an output terminal of the sense amplifier to a high impedance state during precharge operation.

15. The device according to claim 14, wherein the power supply control circuit comprises a switch circuit connected between the outputs of the first and second power supplies, for generating the first and second power supplies having substantially the same potential.

16. The device according to claim 10, wherein the power supply control circuit comprises:
   a first type MOS transistor having a source terminal for receiving a high potential power supply, a drain terminal connected to the sense amplifier and a gate terminal for receiving a first activating signal; and
   a second type MOS transistor having a source terminal for receiving a low potential power supply, a drain terminal connected to the sense amplifier and a gate terminal for receiving a second activating signal that is complementary to the first activating signal.

17. The device according to claim 10, wherein the power supply control circuit comprises a first pair of MOS transistors for generating the first power supply and a second pair of MOS transistors for generating the second power supply, wherein each pair of the MOS transistors are serially connected between a high potential power supply and a low potential power supply, and wherein the first and second pairs of MOS transistors operate in response to a pair of complementary signals such that one of the pairs of MOS transistors is turned on while the other pair of the MOS transistors is turned off.

18. The device according to claim 1 further comprising an enhancing circuit, connected to the secondary bit line, for enhancing a potential corresponding to data read on the secondary bit line from the memory cell using capacitive coupling prior to a sense amplifier amplifying operation.

19. The device according to claim 18, wherein the enhancing circuit comprises:
   an N-MOS capacitor having a drain terminal for receiving a first control signal and a gate terminal connected to the secondary bit line; and
   a P-MOS capacitor having a source terminal for receiving a second control signal and a gate terminal connected to the secondary bit line and the gate terminal of the N-MOS capacitor.

20. The device according to claim 1 further comprising a writing circuit connected to the primary bit line for writing the same data to at least two memory cells to which a predetermined operation is applied sequentially.

21. The device according to claim 20, wherein the writing circuit writes the same data to at least two memory cells to which a self-refresh operation is applied sequentially when the semiconductor memory device is powered on.

22. The device according to claim 20, wherein the writing circuit writes the same data to at least two memory cells to which a refresh operation is applied sequentially when the semiconductor memory device is powered on.

23. The device according to claim 20, wherein the writing circuit writes the same data to at least two memory cells to which a self-refresh operation is applied sequentially in response to an external control signal.

24. The device according to claim 1, wherein the sense amplifier holds a data read at the previous cycle until the sense amplifier deactivates at the present cycle, the device further comprising:
   a register for storing an address signal corresponding to the data read at the previous cycle; and
   a coincidence detecting circuit for detecting the coincidence of the previous cycle address signal stored in the register with an address signal corresponding to a data to be read at the present cycle, wherein the coincidence detecting circuit generates a coincidence signal when the address signal coincidence is detected, and wherein the sense amplifier provides the previous read data as the data for the present cycle in response to the coincidence signal without selecting the word line corresponding to the present cycle address signal.

25. A semiconductor memory device comprising:
   a plurality of primary bit lines;
   a first switching circuit connected to each primary bit line;
   a secondary bit line connected to the first switching circuit, the secondary bit line and one of the primary bit lines forming a first bit line;
   a sense amplifier connected to the secondary bit line for receiving a first predetermined potential from a first power supply and a second power supply;
   a second bit line connected to the sense amplifier;
   a second switching circuit connected between the second bit line and the secondary bit line; and
   a clamping circuit, connected to each primary bit line, for clamping a potential of the associated primary bit line between the first power supply potential and the second power supply potential.

26. The device according to claim 25, wherein the first power supply is a high potential power supply and the second power supply is a low potential power supply, and wherein each clamping circuit comprises;
   a first diode having an anode connected to the primary bit line and a cathode connected to a power supply having a potential lower than that of the high potential power supply by a threshold voltage of the first diode; and
   a second diode having a cathode connected to the primary bit line and an anode connected to a power supply having a potential higher than that of the low potential power supply by a threshold voltage of the second diode.

27. A semiconductor memory device for reading data stored in a plurality of memory cells, the device comprising:
   word lines connected to said memory cells;
   a first bit line and a second bit line, each of the first and second bit lines connected to one of the word lines via one of the memory cells, and each of the first and second bit lines including a primary bit line and a secondary bit line;
   a pair of first switching circuits, one of the first switching circuits connected between the primary and secondary bit lines of the first bit line, the other first switching circuit connected between the primary and secondary bit lines of the second bit line;

a sense amplifier connected between the secondary bit lines; and a second switching circuit connected between the secondary bit lines.

28. The device according to claim 27, wherein when one of the switching circuits is turned on, the other first switching circuit is turned off.

29. A semiconductor memory device comprising:

a plurality of memory cells for storing data;

a plurality of word lines respectively connected to the plurality of memory cells;

a first bit line including a plurality of primary bit lines and a secondary bit line, each of the primary bit lines connected to an associated one of the memory cells;

a plurality of first switching circuits, each connected between one of the primary bit lines and the secondary bit line;

a sense amplifier connected to the secondary bit line;

a second bit line connected to the sense amplifier; and a second switching circuit connected between the second bit line and the secondary bit line.

30. The device according to claim 29, wherein when one of the first switching circuits is turned on, the rest of the first switching circuits are turned off.

31. The device according to claim 29 further comprising a refresh counter for generating an address signal for selecting one of the word lines when a refresh operation is performed, wherein the refresh counter generates the address signal corresponding to the word line so that each of the bit lines is selected in a predetermined order.

32. The device according to claim 29 further comprising:

a refresh counter for generating an address signal for selecting one of the word lines when a refresh operation is performed; and a scramble circuit for receiving the address signal generated by the refresh counter, wherein the scramble circuit converts the address signal such that the bit lines are selected in a predetermined order.

33. A data storage apparatus comprising:

a plurality of memory cells;

a reading device for reading data stored in the plurality of memory cells; and a reset circuit for resetting the data in the memory cells by writing the same data into at least two memory cells, wherein the reading memory device comprises:

word lines connected to said memory cells;

a first bit line, including a primary bit line and a secondary bit line, connected to each memory cell;

a first switching circuit connected between the primary and secondary bit lines;

a sense amplifier connected to the secondary bit line;

a second bit line connected to the sense amplifier; and a second switching circuit connected between the second bit line and one of the primary and secondary bit lines.

34. The apparatus according to claim 33, wherein when a program that uses the reading device is terminated, the reset circuit resets the data by writing the same data into at least two memory cells in a region of the memory cells that was used by the program.

35. The apparatus according to claim 33, wherein the reset circuit resets the data in the memory cells when the data storage apparatus is powered on.

36. A method for reading data in a semiconductor memory device, the method comprising the steps of:

providing a semiconductor memory device comprising:

a plurality of memory cells for storing data;

word lines connected to said memory cells;

a first bit line including a primary bit line connected to said memory cells and a secondary bit lines;

a first switching circuit connected between the primary and secondary bit lines;

a sense amplifier connected to the secondary bit line;

a second bit line connected to the sense amplifier; and a second switching circuit connected between the second bit line and one of the primary and secondary bit lines;

setting an output terminal of the sense amplifier to a high impedance state by deactivating the sense amplifier;

precharging the first and second bit lines by connecting the first and second bit lines to each other to distribute charges stored therein, wherein the first bit line includes the primary and secondary bit lines and has a capacitance greater than that of the second bit line;

reading data on the secondary bit line;

disconnecting the primary bit line from the secondary bit line; and generating read data by amplifying the potential difference between the secondary bit line and the second bit line with the sense amplifier.

37. The method according to claim 36, wherein the data reading step includes a step of disconnecting the primary bit line after secondary bit line for a predetermined time period from the activation of the sense amplifier.

38. The method according to claim 36, wherein the precharging step includes a step of setting a precharge level at the present cycle in accordance with a data level read at the previous cycle.

39. The method according to claim 38, wherein the precharge level at the present cycle is set to a level that is close to a high potential power supply level when the previous read data has the high potential power supply level.

40. The method according to claim 38, wherein the precharge level at the present cycle is set to a level that is close to a low potential power supply level when the previous read data has the low potential power supply level.

41. The method according to claim 36, wherein the high impedance setting step includes a step of supplying the sense amplifier with a first power supply and a second power supply having substantially the same level.

42. The method according to claim 36 further comprising the step of writing the same data into at least two memory cells to which a predetermined operation is applied sequentially.

43. The method according to claim 42, wherein the writing step includes writing the same data into at least two memory cells to which a self-refreshing operation is applied sequentially when the semiconductor memory device has a power switch turned on.

44. The method according to claim 42, wherein the writing step includes writing the same data into at least two memory cells to which a refreshing operation data is applied sequentially when the semiconductor memory device has a power switch turned on.

45. The method according to claim 42, wherein the writing step includes writing the same data into at least two memory cells to which a refreshing operation data is applied sequentially in response to an external control signal input.

46. The method according to claim 36 further comprising a step of writing the same data into the memory cells when the semiconductor memory device has a power switch turned on.

47. The method according to claim 36 further comprising a step of writing the same data into the memory cells when a program that has used the semiconductor memory device is terminated.

48. The method according to claim 36 further comprising the steps of:
- maintaining the data read at the previous cycle until the sense amplifier activates;
- detecting the coincidence of an address signal corresponding to the data read at the previous cycle with an address signal corresponding to the data to be read at the present cycle;
- providing the previous read data as the data for the present cycle when the address signal coincidence is detected.

49. The method according to claim 36, wherein the sense amplifier deactivating step is initiated in response to a read instruction.

50. The method according to claim 36, wherein the sense amplifier deactivating step is initiated after a predetermined time period from receiving a read instruction has elapsed.

51. A method for reading data stored in a semiconductor memory device, the method comprising the steps of:
- providing the semiconductor memory device comprising:
  - a plurality of memory cells for storing data;
  - a plurality of word lines respectively connected to the memory cells;
  - a first bit line including a plurality of primary bit lines and a secondary bit line, each of the primary bit lines connected to one of the associated memory cells;
  - a plurality of first switching circuits, each connected between one of the primary bit lines and the secondary bit line;
  - a sense amplifier connected to the secondary bit line;
  - a second bit line connected to the sense amplifier; and
  - a second switching circuit connected between the second bit line and the secondary bit line;
- setting an output terminal of the sense amplifier to a high impedance state by deactivating the sense amplifier;
- precharging the first and second bit lines by connecting the first and second bit lines together to distribute charges stored therein, wherein the primary bit lines and the secondary bit line, having a capacitance greater than that of the second bit line;
- selecting a world line connected to the memory cell associated with the primary bit line such that the primary bit lines are connected to the secondary bit line in order;
- reading data on the secondary bit line via the primary bit line from the associated memory cell;
- disconnecting the primary bit line from the secondary bit line; and
- generating read data by amplifying the potential difference between the secondary bit line and the second bit line with the sense amplifier.

52. A method for reading data in a semiconductor memory device, the method comprising the steps of:
- providing the semiconductor memory device comprising:
  - a plurality of primary bit lines;
  - a first switching circuit connected to each of the primary bit lines;
  - a secondary bit line connected to the first switching circuit, the secondary bit line and the primary bit lone forming a first bit line;
  - a sense amplifier connected to the secondary bit line for receiving a first predetermined potential from a first power supply and a second predetermined potential from a second power supply;
  - a second bit line connected to the sense amplifier;
  - a second switching circuit connected between the second bit line and the secondary bit line; and
  - a clamping circuit connected to each of the primary bit lines for clamping the potential of the associated primary bit line between the first power supply potential and the second power supply potential;
- setting an output terminal of the sense amplifier to a high impedance by deactivating the sense amplifier;
- precharging the first and second bit lines by connecting the bit lines together to distribute charges stored therein, wherein the plurality of primary bit lines and the secondary bit line have a capacitance greater than that of the second bit line;
- selecting a world line connected to the clamp circuit associated with the primary bit line such that the primary bit lines are connected to the secondary bit line in order;
- reading data on the secondary bit line via the primary bit line from the associated clamp circuit;
- disconnecting the primary bit line from the secondary bit line; and
- generating read data by amplifying the potential difference between the secondary bit line and the second bit line with the sense amplifier.

* * * * *